(12) United States Patent
Choi

(10) Patent No.: US 11,239,362 B2
(45) Date of Patent: Feb. 1, 2022

(54) SEMICONDUCTOR DEVICES HAVING STRESSED ACTIVE REGIONS THEREIN AND METHODS OF FORMING SAME

(71) Applicant: Samsung Electronics Co., Ltd., Suwon-si (KR)

(72) Inventor: Hoon-Sung Choi, Seoul (KR)

(73) Assignee: Samsung Electronics Co., Ltd.

( * ) Notice: Subject to any disclaimer, the term of this patent is extended or adjusted under 35 U.S.C. 154(b) by 191 days.

(21) Appl. No.: 16/412,463

(22) Filed: May 15, 2019

(65) Prior Publication Data
US 2019/0393348 A1     Dec. 26, 2019

(30) Foreign Application Priority Data
Jun. 21, 2018   (KR) ......................... 10-2018-0071254

(51) Int. Cl.
| | |
|---|---|
| *H01L 29/78* | (2006.01) |
| *H01L 29/66* | (2006.01) |
| *H01L 21/02* | (2006.01) |
| *H01L 29/06* | (2006.01) |

(Continued)

(52) U.S. Cl.
CPC .... *H01L 29/7848* (2013.01); *H01L 21/02532* (2013.01); *H01L 21/76224* (2013.01);
(Continued)

(58) Field of Classification Search
CPC .......... H01L 29/7848; H01L 29/66795; H01L 29/66636; H01L 21/02532; H01L 29/7851; H01L 29/0653; H01L 29/165; H01L 29/0847; H01L 21/76224; H01L 21/76283; H01L 27/1203; H01L 21/84; H01L 29/66575; H01L 29/1054; H01L 29/66568; H01L 27/088; H01L 21/823412
See application file for complete search history.

(56) References Cited

U.S. PATENT DOCUMENTS

| | | | |
|---|---|---|---|
| 7,227,205 B2 | 6/2007 | Bryant et al. | |
| 7,619,239 B2 | 11/2009 | Irisawa et al. | |

(Continued)

FOREIGN PATENT DOCUMENTS

| | | |
|---|---|---|
| EP | 1790012 | 1/2014 |
| JP | 5561311 | 9/2012 |

(Continued)

*Primary Examiner* — Thanh T Nguyen
(74) *Attorney, Agent, or Firm* — Myers Bigel, P.A.

(57) ABSTRACT

A method of fabricating a semiconductor device includes providing a substrate including a semiconductor material having a first lattice constant and then patterning the substrate to form a first semiconductor pattern extending in a first direction. A second semiconductor pattern is also formed on and in contact with the first semiconductor pattern. The second semiconductor pattern extends in the first direction and has a second lattice constant that is sufficiently greater than the first lattice constant so that lattice stress is present at an interface between the first semiconductor pattern and the second semiconductor pattern. The second semiconductor pattern is further patterned to define a sidewall of the second semiconductor pattern that extends in a second direction intersecting the first direction. A gate electrode is formed, which extends in the first direction on the second semiconductor pattern.

20 Claims, 31 Drawing Sheets

(51) Int. Cl.
  *H01L 29/165*  (2006.01)
  *H01L 29/08*   (2006.01)
  *H01L 21/762*  (2006.01)

(52) U.S. Cl.
  CPC ...... *H01L 29/0653* (2013.01); *H01L 29/0847* (2013.01); *H01L 29/165* (2013.01); *H01L 29/66636* (2013.01); *H01L 29/66795* (2013.01); *H01L 29/7851* (2013.01)

(56) References Cited

U.S. PATENT DOCUMENTS

| | | |
|---|---|---|
| 7,808,081 B2 | 10/2010 | Bryant et al. |
| 8,426,926 B2 | 4/2013 | Shin et al. |
| 9,142,642 B2 | 9/2015 | Chen et al. |
| 9,324,836 B2 | 4/2016 | Chen et al. |
| 9,570,465 B2 | 2/2017 | Vinet et al. |
| 9,722,082 B2 | 8/2017 | Chen et al. |
| 2009/0305474 A1 | 12/2009 | Bryant et al. |
| 2010/0244139 A1 | 9/2010 | Bryant et al. |
| 2016/0172495 A1* | 6/2016 | Zhu .................. H01L 21/02433 257/192 |
| 2016/0181383 A1* | 6/2016 | Huang .............. H01L 29/41791 257/757 |

FOREIGN PATENT DOCUMENTS

| | | |
|---|---|---|
| KR | 10-0756125 | 12/2006 |
| KR | 10-0956575 | 3/2007 |
| KR | 10-1674179 | 10/2011 |
| KR | 10-1386838 | 8/2013 |
| WO | 2006006972 | 1/2006 |

* cited by examiner

SEMICONDUCTOR DEVICES HAVING STRESSED ACTIVE REGIONS THEREIN AND METHODS OF FORMING SAME

This application claims priority under 35 U.S.C. § 119 to Korean Patent Application No. 10-2018-0071254, filed Jun. 21, 2018, the disclosure of which is hereby incorporated herein by reference.

BACKGROUND

1. Technical Field

The present inventive concept relates to semiconductor devices and methods of forming same and, more particularly, to semiconductor devices having stressed channel regions therein and methods of forming same.

2. Description of the Related Art

As feature sizes of MOS transistors decrease, a gate length and a length of a channel formed below the gate may also decrease. And, as the channel length of the transistor decreases, scattering of charge in the channel typically increases and charge mobility typically decreases. The decrease in charge mobility may be an obstacle in continued improvement of a saturation current of a transistor.

Therefore, various research efforts for improving the charge mobility in the transistor with the reduced channel length are in progress.

SUMMARY

Aspects of the present inventive concept provide a method for fabricating a semiconductor device capable of fabricating a semiconductor device having improved operating performance and capable of downsizing.

Aspects of the present inventive concept provide a semiconductor device having improved operating performance and capable of downsizing.

The aspects of the present inventive concept are not restricted to those mentioned above and another aspect which is not mentioned may be clearly understood by those skilled in the art from the description below.

According to aspects of the present inventive concept, there is provided a method for fabricating a semiconductor device, the method comprising providing a substrate including a semiconductor material having a first lattice constant, patterning the substrate to form a first semiconductor pattern extending in a first direction, forming a second semiconductor pattern on the first semiconductor pattern, the second semiconductor pattern extending in the first direction and having a second lattice constant greater than the first lattice constant, patterning the second semiconductor pattern to form a sidewall of the second semiconductor pattern extending in a second direction intersecting the first direction, and forming a gate electrode extending in the first direction on the second semiconductor pattern.

According to aspects of the present inventive concept, there is provided a method for fabricating a semiconductor device, the method comprising providing a substrate in which a first semiconductor film, a buried insulating film and a second semiconductor film are sequentially stacked, forming a first trench extending in a first direction in the second semiconductor film, performing an epitaxial growth process using the second semiconductor film as a seed to form a semiconductor pattern extending in the first direction, forming a second trench defining a sidewall of the semiconductor pattern extending in a second direction intersecting the first direction, and forming an element isolation film which fills the first trench and the second trench.

According to aspects of the present inventive concept, there is provided a method for fabricating a semiconductor device, the method comprising providing a substrate including a semiconductor material having a first lattice constant, forming a semiconductor pattern on the substrate, the semiconductor pattern including a first sidewall and a second sidewall intersecting the first sidewall, and the semiconductor pattern having a second lattice constant greater than the first lattice constant, forming an element isolation film which surrounds the first sidewall and the second sidewall, on the substrate, and forming a gate electrode intersecting the second sidewall on the semiconductor pattern and the element isolation film, wherein a first angle formed between a lower surface of the semiconductor pattern and the first sidewall is greater than a second angle formed between the lower surface of the semiconductor pattern and the second sidewall.

According to aspects of the present inventive concept, there is provided a semiconductor device comprising a substrate including a semiconductor material having a first lattice constant, a semiconductor pattern on the substrate, the semiconductor pattern including a first sidewall and a second sidewall intersecting the first sidewall, and the semiconductor pattern having a second lattice constant greater than the first lattice constant, an element isolation film which surrounds the first sidewall and the second sidewall on the substrate, and a gate electrode intersecting the second sidewall on the semiconductor pattern and the element isolation film, wherein a first angle formed between a lower surface of the semiconductor pattern and the first sidewall is greater than a second angle formed between the lower surface of the semiconductor pattern and the second sidewall.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Hereinafter, a semiconductor device and a method for fabricating the semiconductor device according to some embodiments of the present inventive concept will be described with reference to FIGS. 1 to 44.

Figure 5:
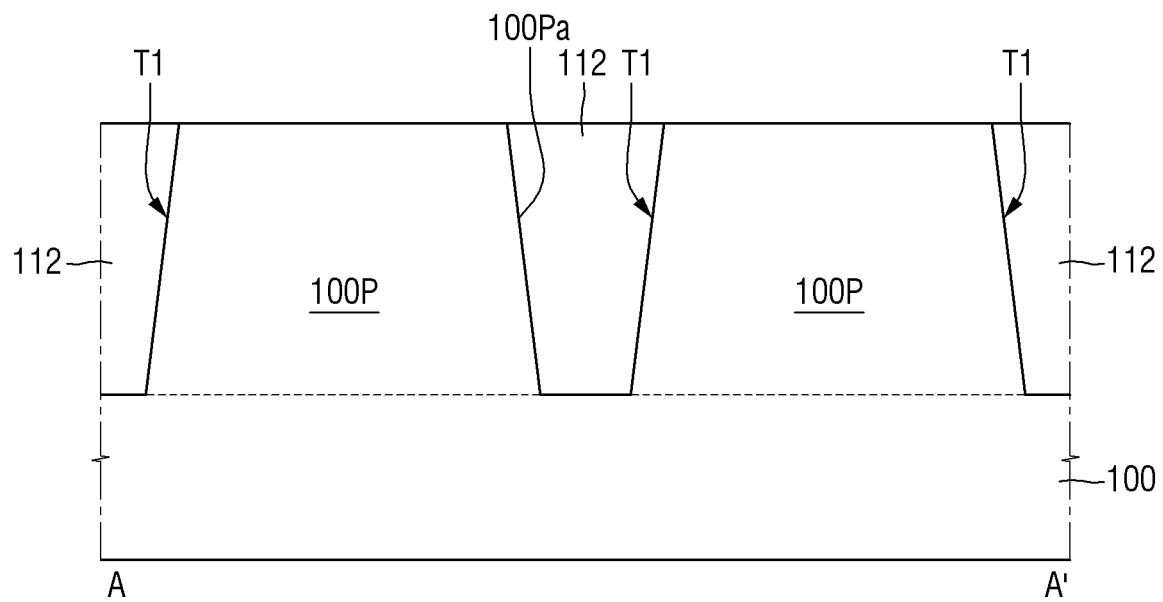
Figure 6:
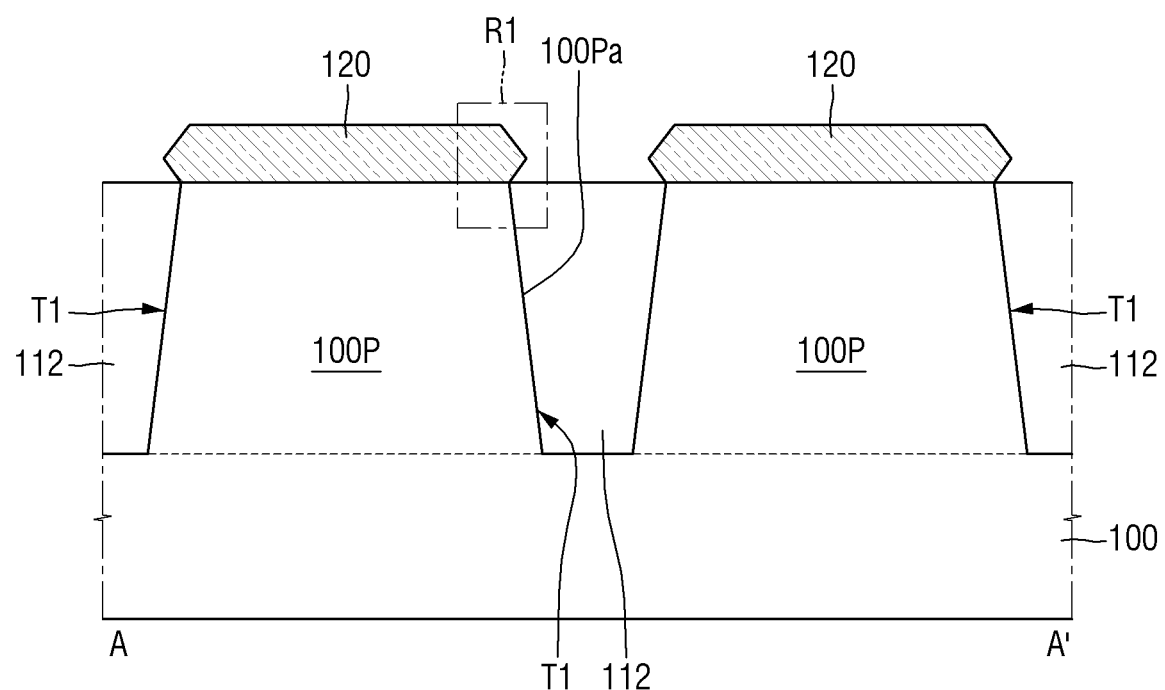
Figure 7:
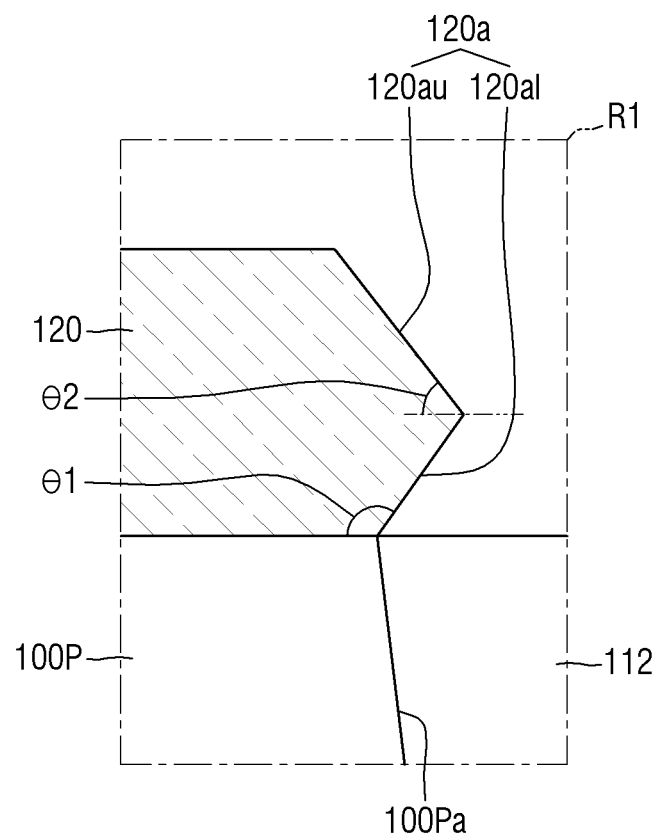
Figure 11:
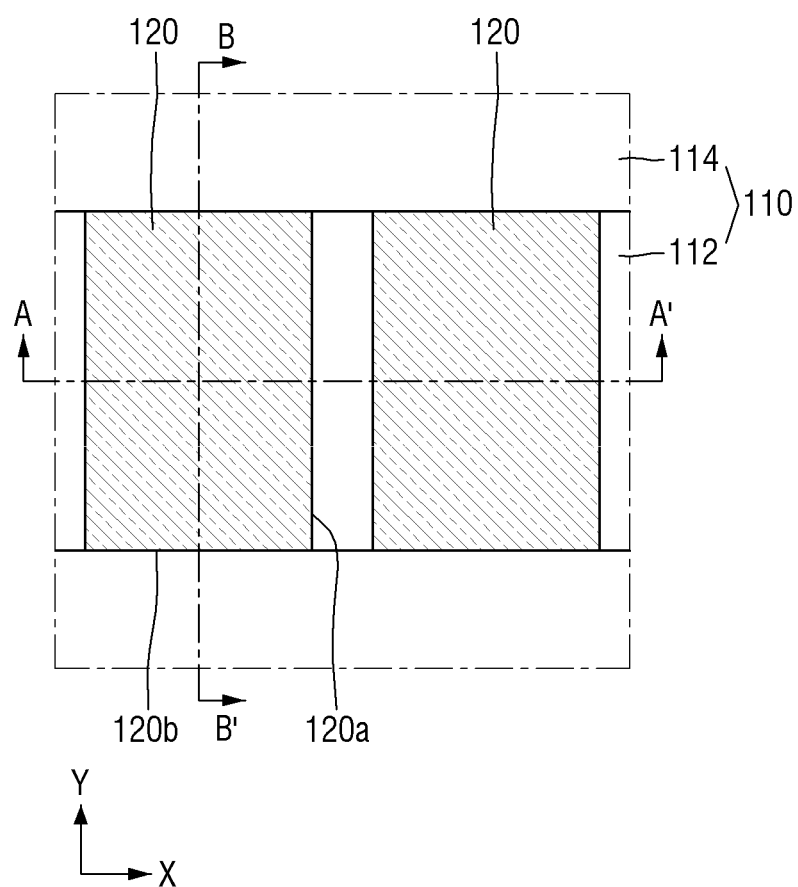
Figure 12:
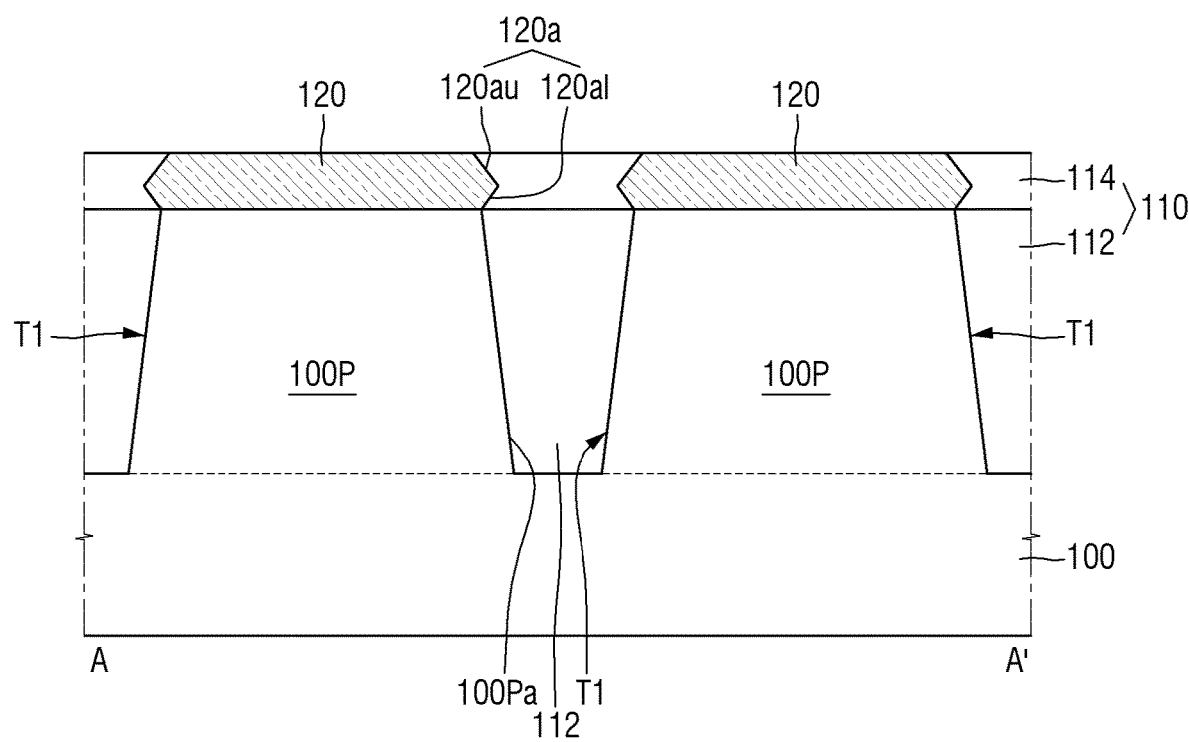
Figure 13:
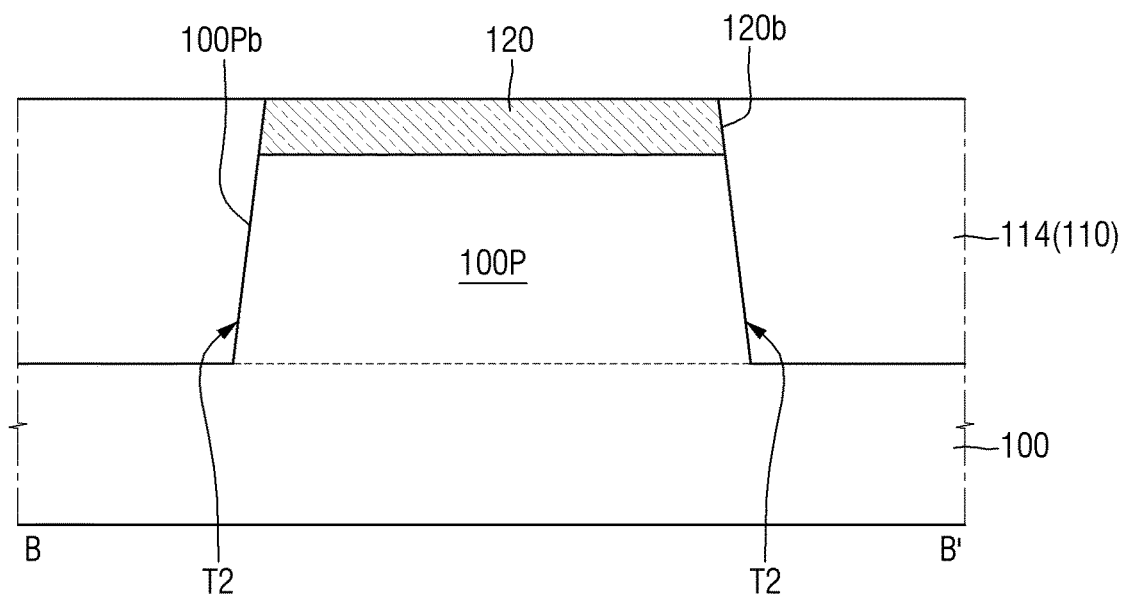

FIGS. 1 to 16 are intermediate step diagrams for explaining the semiconductor device and the method for fabricating the semiconductor device according to some embodiments of the present inventive concept. For reference, FIG. 2 is a cross-sectional view taken along line A-A' of FIG. 1. FIGS. 4 to 6 are cross-sectional views taken along line A-A' of FIG. 3. FIG. 7 is an enlarged view of R1 of FIG. 6. FIG. 9 is a cross-sectional view taken along line B-B' of FIG. 8. FIG. 10 is an enlarged view of R2 of FIG. 9. FIG. 12 is a cross-sectional view taken along line A-A' of FIG. 11, and FIG. 13 is a cross-sectional view taken along line B-B' of FIG. 11. FIGS. 15 and 16 are cross-sectional views taken along line A-A' of FIG. 14.

Figure 1:
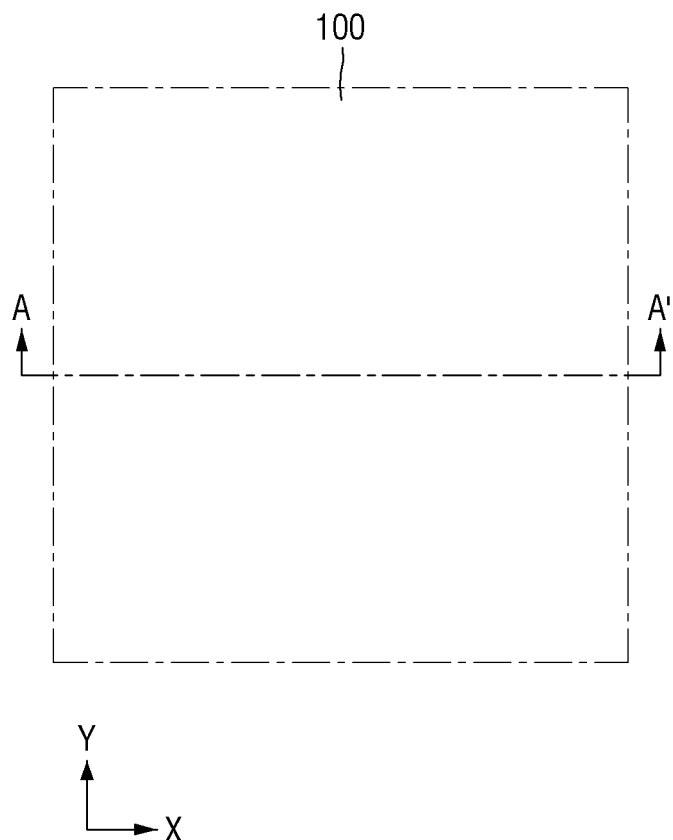
FIGS. 1 to 16 are intermediate step diagrams for explaining the semiconductor device and the method for fabricating the semiconductor device according to some embodiments of the present inventive concept.
Figure 2:

Referring now to FIGS. 1 and 2, a substrate 100 is provided, which may include, but is not limited to, a base substrate, and an epitaxial layer grown on the base substrate. The substrate 100 may also include only the base substrate without the epitaxial layer. The substrate 100 may be a silicon substrate, a gallium arsenide substrate, a silicon germanium substrate, a ceramic substrate, a quartz substrate, a display glass substrate, or the like, and may even be an SOI (semiconductor on insulator) substrate. Hereinafter, the substrate 100 will be described as including silicon (Si) for purposes of illustration. Moreover, the substrate 100 will be treated as a semiconductor material having a first lattice constant.

Figure 3:
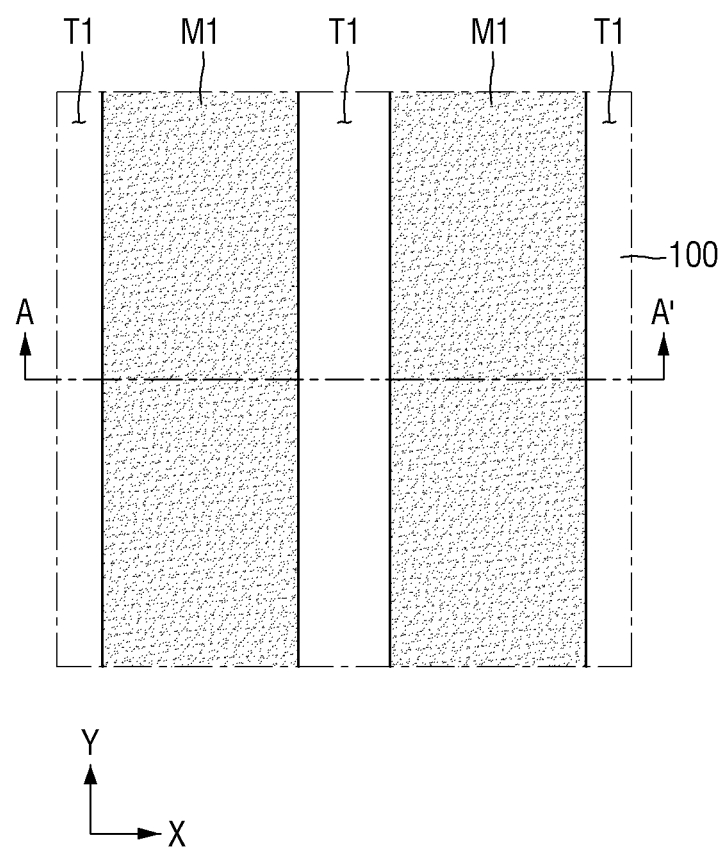
Figure 4:
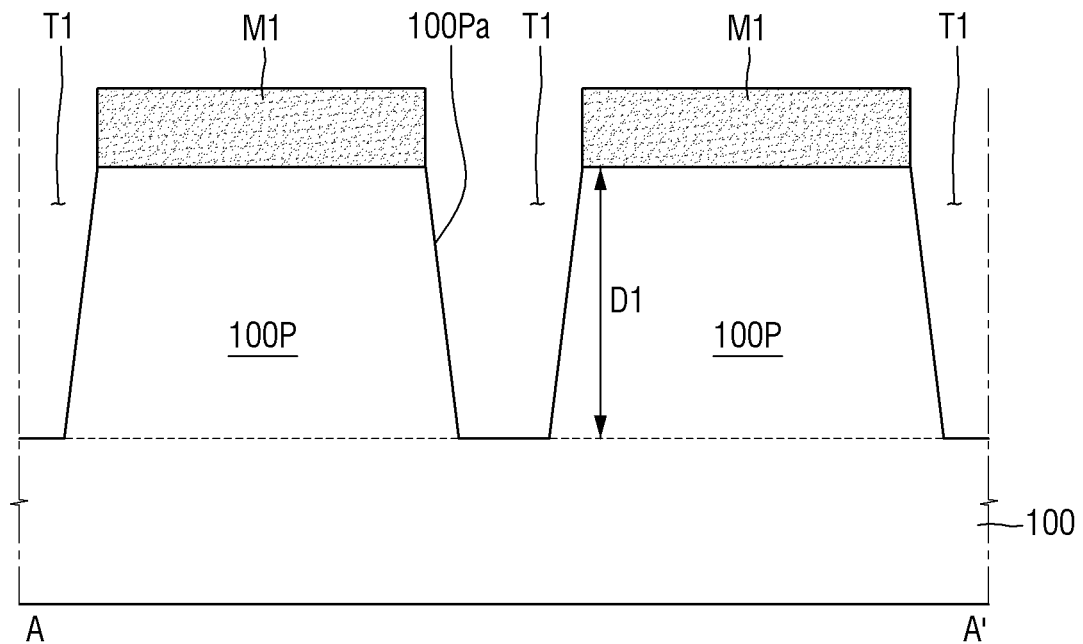

Referring to FIGS. 3 and 4, a first semiconductor pattern 100P extending in a first direction Y is formed in the substrate 100. As shown, a first trench T1 extending in the first direction Y may be formed in the substrate 100 to thereby define the first semiconductor pattern 100P. The formation of the first trench T1 may be performed by a photolithography process, for example. For example, a first mask M1 extending in the first direction Y may be formed on the substrate 100. Subsequently, the substrate 100 may be patterned, using the first mask M1 as an etching mask. Thus, the first semiconductor pattern 100P including a first sidewall 100Pa extending in the first direction Y may be formed. After the first semiconductor pattern 100P is formed, the first mask M1 may be removed. As illustrated, the first trench T1 may have a tapered shape, but this is only a feature in the process of forming the first trench T1 and the present disclosure is not limited thereto.

The first trench T1 may be formed to a predetermined depth. For example, the first trench T1 may be formed at a first depth D1 on the basis of an upper surface of the substrate 100 (or an upper surface of the first semiconductor pattern 100P).

Referring to FIG. 5, a first insulating pattern 112 is formed in the first trench T1. For example, an insulating film that fills the first trench T1 may be formed on the first semiconductor pattern 100P. Subsequently, as planarization process may be performed until the upper surface of the first semiconductor pattern 100P is exposed. The formation of the first insulating pattern 112 may be performed by an STI (Shallow Trench Isolation) process, for example, but the present disclosure is not limited thereto. As a result, a first insulating pattern 112 which surrounds the first sidewall 100Pa of the first semiconductor pattern 100P may be formed. Further, the first insulating pattern 112 may expose the upper surface of the first semiconductor pattern 100P. The first insulating pattern 112 may include, for example, at least one of silicon oxide, silicon nitride, silicon oxynitride, and combinations thereof.

Referring to FIGS. 6 and 7, a second semiconductor pattern 120 is formed on the first semiconductor pattern 100P. The second semiconductor pattern 120 may be formed to extend in the first direction Y on the first semiconductor pattern 100P. Therefore, as illustrated in FIG. 7, the second semiconductor pattern 120 including the second sidewall 120a extending in the first direction Y may be formed.

The second semiconductor pattern 120 may have a second lattice constant different from the first lattice constant associated with the first semiconductor pattern 100P. Therefore, compressive stress or tensile stress may be applied to the second semiconductor pattern 120. In some embodiments, the second semiconductor pattern 120 may have a second lattice constant greater than the first lattice constant. For example, the first semiconductor pattern 100P may include silicon (Si) and the second semiconductor pattern 120 may include silicon germanium (SiGe). As a result, the compressive stress may be applied by the first semiconductor pattern 100P to the second semiconductor pattern 120. The compressive stress may include a first compressive stress applied to the second semiconductor pattern 120 in the first direction Y, and a second compressive stress applied to the second semiconductor pattern 120 in the second direction X.

In some embodiments, formation of the second semiconductor pattern 120 may include crystal-growth of the second semiconductor pattern 120 on the first semiconductor pattern 100P. For example, an epitaxial growth process using an upper surface of the first semiconductor pattern 100P as a seed may be performed. Since an upper surface of the first semiconductor pattern 100P is exposed by the first insulating pattern 112, the second semiconductor pattern 120 may be formed on the upper surface of the first semiconductor pattern 100P.

In some embodiments, the second sidewall 120a of the second semiconductor pattern 120 may include a facet. For example, as illustrated in FIG. 7, the second sidewall 120a of the second semiconductor pattern 120 may include a lower sidewall 120al being in contact with the upper surface of the first semiconductor pattern 100P, and an upper sidewall 120au on the lower sidewall 120al.

In some embodiments, a first angle θ1 formed between a lower surface of the second semiconductor pattern 120 and the lower sidewall 120al may be greater than a second angle θ2 formed between the lower surface of the second semiconductor pattern 120 and the upper sidewall 120au. For example, as illustrated, the first angle θ1 may be an obtuse angle and the second θ2 may be an acute angle. Here, the first angle θ1 and the second θ2 refer to angles formed in the second semiconductor pattern 120.

Figure 8:
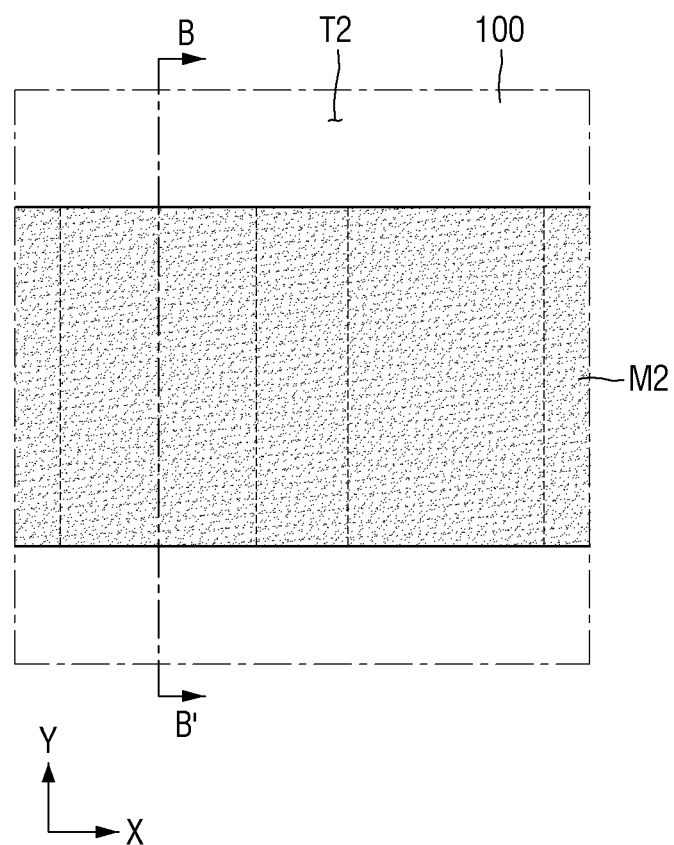
Figure 9:
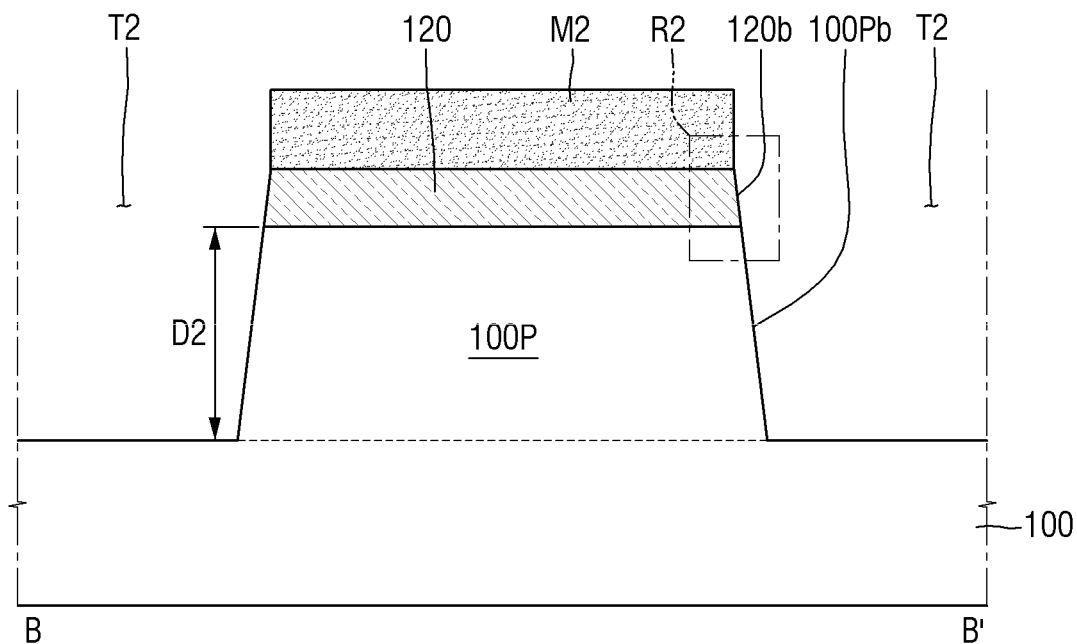
Figure 10:
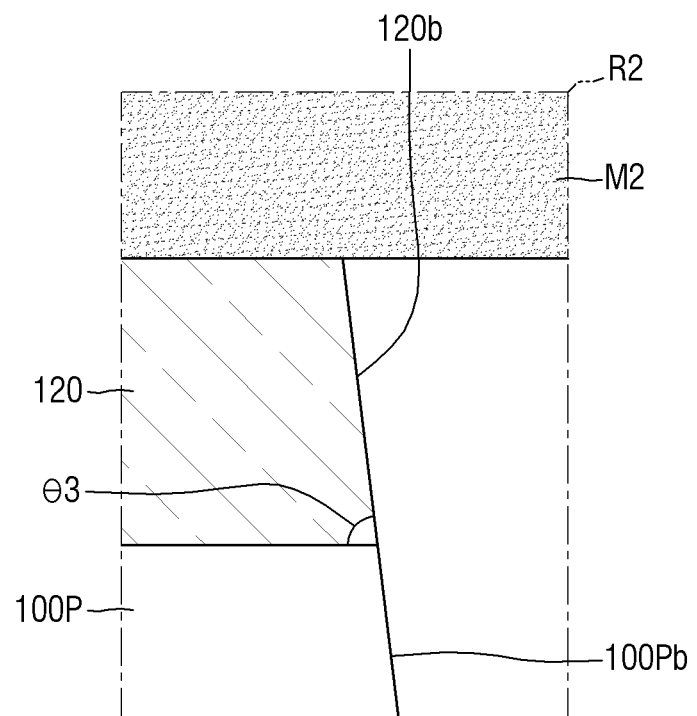

Referring to FIGS. 8 to 10, a third sidewall 120b of the second semiconductor pattern 120 extending in the second direction X intersecting the first direction Y is formed. For example, a second trench T2 extending in the second direction X may be formed in the second semiconductor pattern 120. Formation of the second trench T2 may be performed, for example, by a photolithographically-defined etching process. For example, a second mask M2 extending in the second direction X may be formed on the second semiconductor pattern 120. Subsequently, the second semiconductor pattern 120 may be patterned, using the first mask M1 as an etching mask. Thus, the second semiconductor pattern 120 including the third sidewall 120b extending in the second direction X may be formed. After the third sidewall 120b of the second semiconductor pattern 120 is formed, the second mask M2 may be removed.

The second direction X is illustrated as being orthogonal to the first direction Y, but the present disclosure is not limited thereto. For example, the second direction X may be another direction which is not parallel to the first direction Y. The second trench T2 is illustrated as having a tapered shape, but this is only a feature in the process of forming the second trench T2, and the present disclosure is not limited thereto.

As illustrated in FIG. 10, the third sidewall 120b of the second semiconductor pattern 120 may form a third θ3 with the lower surface of the second semiconductor pattern 120. Here, the third angle θ3 refers to an angle formed in the second semiconductor pattern 120. In some embodiments, the third angle θ3 formed between the lower surface of the second semiconductor pattern 120 and the third sidewall 120b may be different from the first angle (θ1 of FIG. 7) formed between the lower surface of the second semiconductor pattern 120 and the lower sidewall 120al. For example, the first angle θ 1 may be an obtuse angle and the third angle θ3 may be an acute angle (or a right angle).

In some embodiments, as the second trench T2 is formed in the second semiconductor pattern 120, the first compressive stress applied to the second semiconductor pattern 120 in the first direction Y may be relaxed. However, since the second trench T2 is formed to extend along the second direction X, the second compressive stress applied to the second semiconductor pattern 120 in the second direction X may be maintained. In some embodiments, a first compressive stress applied to the second semiconductor pattern 120 in the first direction Y may be smaller than the second compressive stress applied to the second semiconductor pattern 120 in the second direction X.

In some embodiments, formation of the second trench T2 may also include patterning of the first semiconductor pattern 100P. For example, the lower surface of the second trench T2 may be formed to be lower than the lower surface of the second semiconductor pattern 120. Thus, the first semiconductor pattern 100P including the fourth sidewall 100Pb extending in the second direction X may be formed. Also, the sidewall of the second trench T2 may be defined by the third sidewall 120b of the second semiconductor pattern 120 and the fourth sidewall 100Pb of the first semiconductor pattern 100P. Also, in some embodiments, formation of the second trench T2 may also include patterning of the first insulating pattern 112.

The second trench T2 may be formed at a predetermined depth. For example, the second trench T2 may be formed at a second depth D2 on the basis of the upper surface of the substrate 100 (or the upper surface of the first semiconductor pattern 100P). The second depth D2 is illustrated as being the same as the first depth (D1 of FIG. 4), but the present disclosure is not limited thereto. For example, the second depth D2 may be deeper than the first depth D1.

Referring to FIGS. 11 to 13, a second insulating pattern 114 is formed in the second trench T2. For example, an insulating film for filling the second trench T2 may be formed on the first semiconductor pattern 100P and the second semiconductor pattern 120. Subsequently, the planarization process may be performed until the upper surface of the second semiconductor pattern 120 is exposed. Formation of the second insulating pattern 114 may be performed, for example, by an STI process, but the present disclosure is not limited thereto.

As a result, as illustrated in FIG. 12, a second insulating pattern 114 which surrounds the second sidewall 120a of the second semiconductor pattern 120 may be formed. Also, as illustrated in FIG. 13, a second insulating pattern 114 which surrounds the fourth sidewall 100Pb of the first semiconductor pattern 100P and the third sidewall 120b of the second semiconductor pattern 120 may be formed. Further, the second insulating pattern 114 may expose the upper surface of the second semiconductor pattern 120.

The first insulating pattern 112 and the second insulating pattern 114 may form an element isolation film 110. That is, the element isolation film 110 may be formed on the substrate to surround the first sidewall 100Pa of the first semiconductor pattern 100P, the second sidewall 120a of the second semiconductor pattern 120, the fourth sidewall 100Pb of the first semiconductor pattern 100P, and the third sidewall 120b of the second semiconductor pattern 120.

The second insulating pattern 114 may include, for example, at least one of silicon oxide, silicon nitride, silicon oxynitride, and combinations thereof. The second insulating pattern 114 may include, but is not limited to, substantially the same material as the first insulating pattern 112. For example, the second insulating pattern 114 may include an insulating material different from the first insulating pattern 112.

Figure 14:
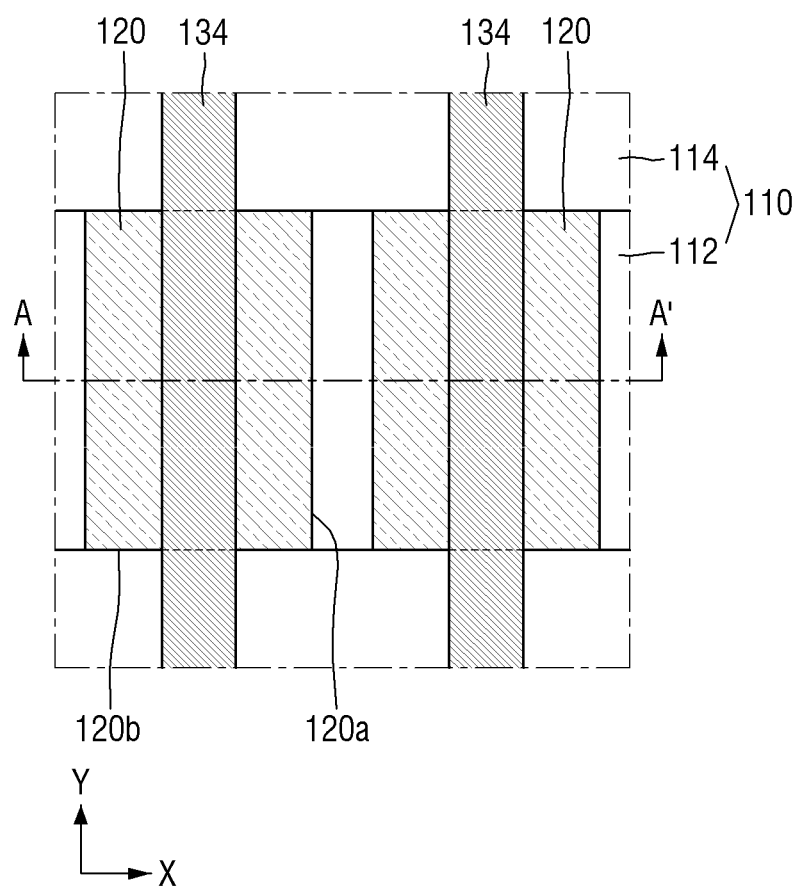
Figure 15:
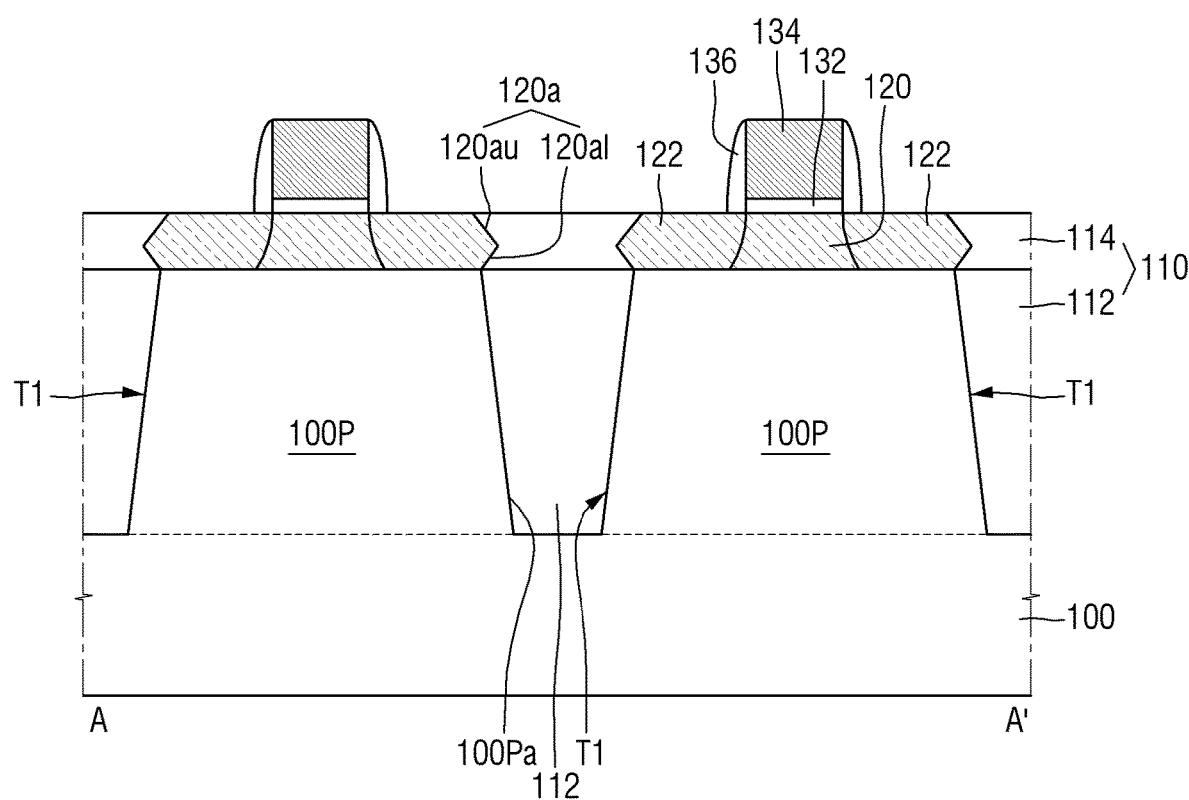
Figure 16:
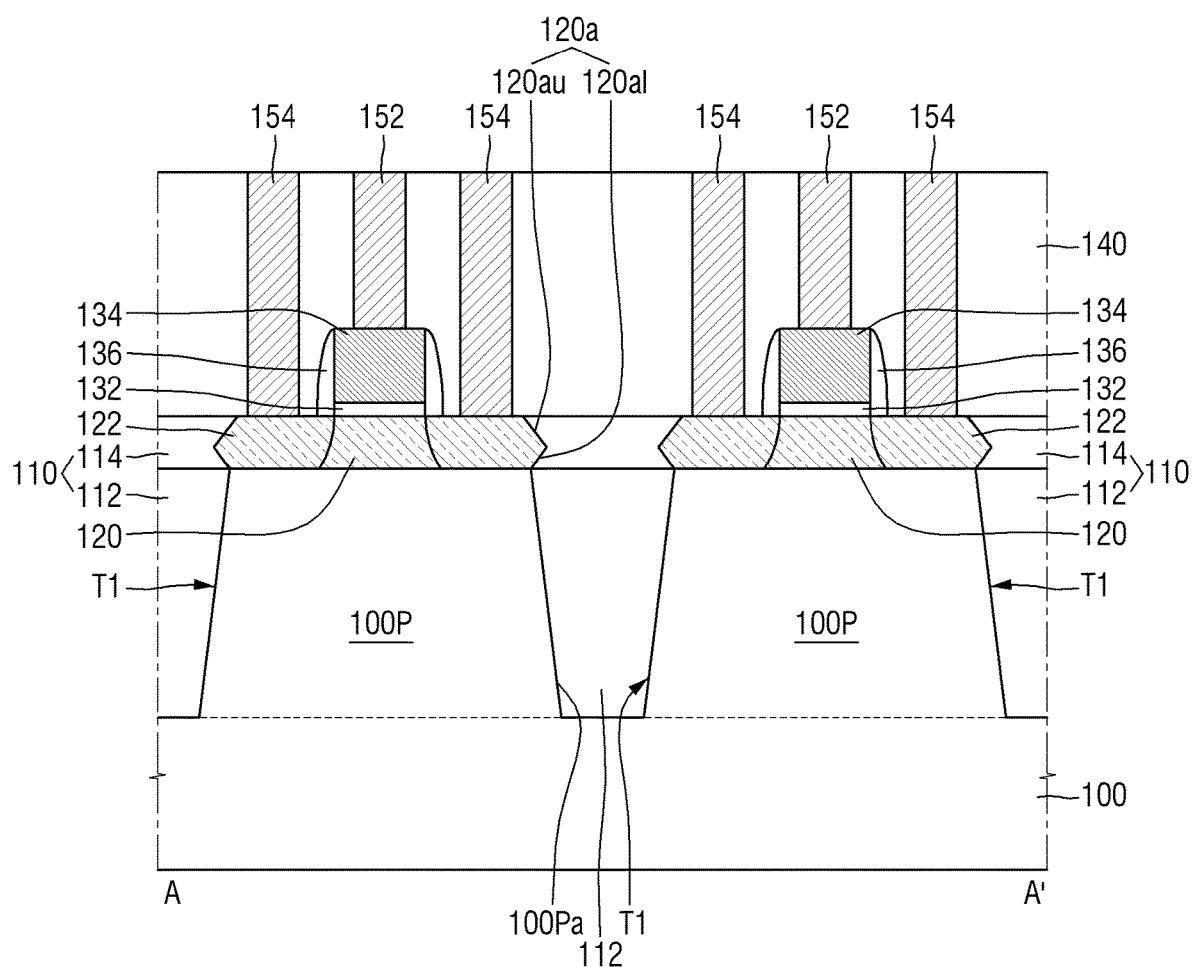

Referring to FIGS. 14 and 15, a gate dielectric film 132, a gate electrode 134, a gate spacer 136, and a source/drain region 122 are formed on/in the second semiconductor pattern 120. For convenience of explanation, in FIG. 14, only the gate electrode 134 is illustrated. Hereinafter, the gate electrode 134 is described as being formed by a gate first process, but the present disclosure is not limited thereto. For example, the gate electrode 134 may be formed by a gate last process or a replacement process. For example, a dielectric film and a conductive film may be sequentially formed on the second semiconductor pattern 120 and the element isolation film 110. Next, the dielectric film and the conductive film may be patterned. As a result, the gate dielectric film 132 and the gate electrode 134 may be formed on the second semiconductor pattern 120. In some embodiments, the gate dielectric film 132 and the gate electrode 134 may be formed to extend in the first direction Y, as shown by FIG. 14.

The gate dielectric film 132 may include an electrically insulating material such as silicon oxide, silicon nitride, silicon oxynitride and a high dielectric constant material having a dielectric constant higher than silicon oxide. The high dielectric constant material may include, but is not limited to, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The gate electrode 134 may include, but is not limited to, for example, polysilicon or a metal material. The gate electrode 134 is illustrated as being a single film, but the present disclosure is not limited thereto. For example, the gate electrode 134 may be formed by stacking a plurality of conductive materials. For example, the gate electrode 134 may include a work function adjusting film for adjusting a work function, and a filling conductive film for filling a space formed by the work function adjusting film. The work function adjusting film may include at least one of, for example, TiN, TaN, TiC, TaC, TiAlC, and combinations thereof. The filling conductive film may include, for example, W or Al. The gate electrode 134 may be formed by, for example, a replacement process, but the present disclosure is not limited thereto.

The gate spacer 136 may be formed on the sidewall of the gate electrode 134. For example, a spacer film may be formed on the gate dielectric film 132 and the gate electrode 134. Next, the spacer film may be patterned to form the gate spacer 136 on the sidewall of the gate electrode 134. Since the gate electrode 134 may extend in the first direction Y, the gate spacer 136 may also extend in the first direction Y. The gate spacer 136 may include, for example, at least one of silicon oxide, silicon nitride, silicon oxynitride, and combinations thereof.

The source/drain region 122 may be formed in the second semiconductor pattern 120 on the sidewall of the gate electrode 134. The formation of the source/drain region 122 may be performed by, for example, an ion implantation process. For example, the gate electrode 134 and/or the gate spacer 136 may be used as a mask to dope impurities into the second semiconductor pattern 120.

However, the present disclosure is not limited thereto, and the formation of the source/drain region 122 may be performed by an epitaxial growth process. For example, after removing a part of the second semiconductor pattern 120, the source/drain region 122 may also be formed using an epitaxial growth process. In some embodiments, the source/drain region 122 may include p-type impurities. For example, the gate electrode 134 and/or the gate spacer 136 may be used as a mask to dope the p-type impurities into the second semiconductor pattern 120.

Referring to FIG. 16, an interlayer insulating film 140, a first contact 152 and a second contact 154 are formed. The interlayer insulating film 140 may be formed to cover the second semiconductor pattern 120, the element isolation film 110, the gate electrode 134 and the gate spacer 136. The interlayer insulating film 140 may include at least one of silicon oxide, silicon nitride, silicon oxynitride and a low dielectric constant material having a dielectric constant lower than silicon oxide. The low dielectric constant material may include, but is not limited to, for example, at least one of FOX (Flowable Oxide), TOSZ (Torene SilaZene), USG (Undoped Silica Glass), BSG (Borosilica Glass), PSG (PhosphoSilica Glass), BPSG (Boro Phospho Silica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

As illustrated, the vertical first contact 152 may be formed to be connected to the gate electrode 134, and the vertical second contact 154 may be formed to be connected to the source/drain region 122. For example, a contact through-hole which exposes the gate electrode 134 and the source/drain region 122 may be formed in the interlayer insulating film 140. Next, the conductive material may be filled in the contact hole. Accordingly, the first contact 152 penetrating the interlayer insulating film 140 and connected to the gate electrode 134 may be formed. Further, the second contact 154 penetrating the interlayer insulating film 140 and connected to the source/drain region 122 may be formed.

The charge mobility of each semiconductor device may be improved by controlling the stress applied to each respective channel. For example, in a P-type MOS transistor, the mobility of charges (holes) may be improved by applying a compressive stress in a length direction of the channel (for example, the second direction X). However, in the P-type MOS transistor, the compressive stress applied in the width direction of the channel (for example, the first direction Y) causes a reduction in charge mobility.

However, the method for fabricating the semiconductor device according to some embodiments may provide the semiconductor device with improved charge mobility, by relaxing the compressive stress applied in the width direction of the channel (for example, the first direction Y). For example, as described above with reference to FIGS. 8 to 10, by patterning the second semiconductor pattern 120 in the second direction X, the first compressive stress applied to the second semiconductor pattern 120 in the first direction Y may be relaxed. However, since the second semiconductor pattern 120 is not separately patterned in the first direction Y, the second compressive stress applied to the second semiconductor pattern 120 in the second direction X may be maintained. Therefore, a semiconductor device with improved charge mobility and improved operating performance may be provided.

Further, the second semiconductor pattern 120 may be formed to extend in the first direction Y without being separately patterned in the first direction Y. As described above with reference to FIGS. 6 and 7, by forming the second semiconductor pattern 120 on the first semiconductor pattern 100P extending in the first direction Y, the second semiconductor pattern 120 extending in the second semiconductor pattern Y may be formed. Therefore, it is possible to provide a semiconductor device capable of being reduced in size but with no loss in charge mobility.

Accordingly, as described hereinabove with respect to FIGS. 1-16, a field effect transistor according to an embodiment of the invention may include a lattice-strained second semiconductor pattern 120 that defines a semiconductor heterojunction (e.g., SiGe—Si junction) with an underlying first semiconductor pattern 100P. The lattice-strained second semiconductor pattern 120 has a first pair of photolithographically-defined and etched sidewalls 120b that extend in a first direction, as shown by FIG. 13, and a second pair of sidewalls 120a that extend in a second direction and have a sidewall profile 120au, 120al defined by epitaxial lateral overgrowth (ELO) during the fabrication steps illustrated by FIGS. 6-7. FIG. 16 further illustrates P-channel field effect transistors having channel, source and drain regions 120, 122 within the lattice-strained second semiconductor patterns 120, and insulated gate electrodes (132, 134 and 136) on the second semiconductor patterns 120.

Figure 17:
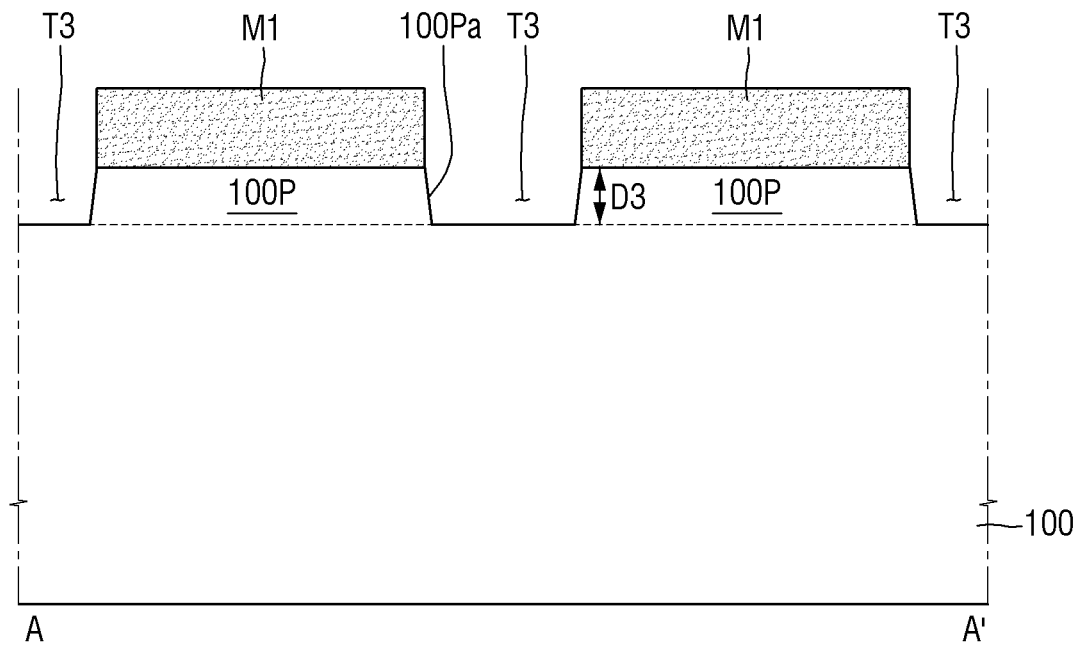
FIGS. 17 to 24 are intermediate step diagrams for explaining a method for fabricating a semiconductor device according to some embodiments of the present inventive concept.
Figure 18:
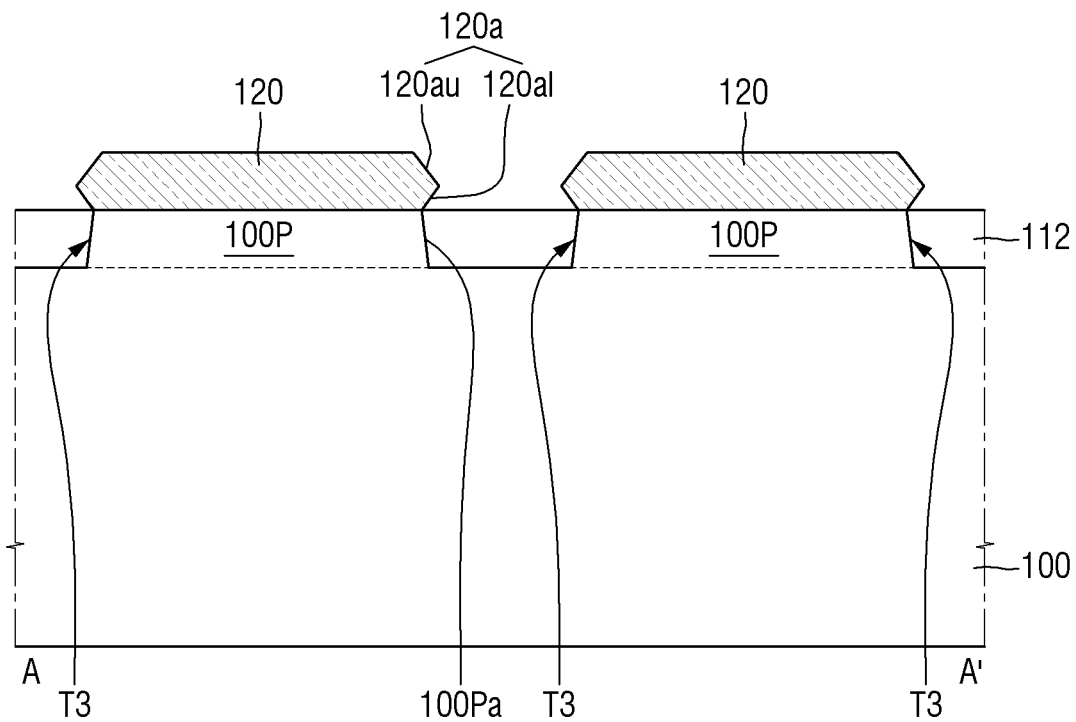
Figure 19:
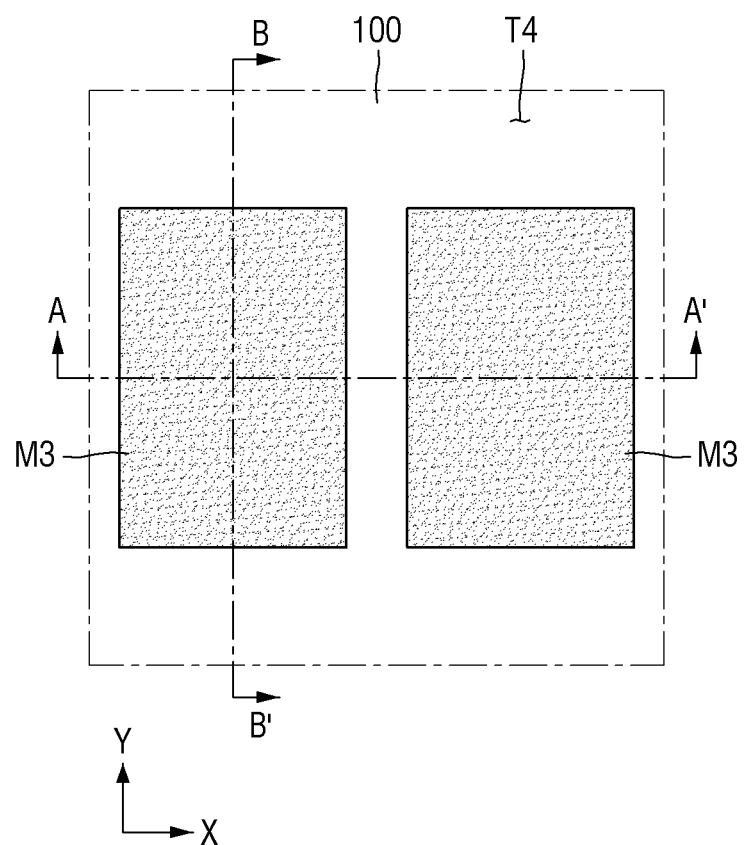
Figure 20:
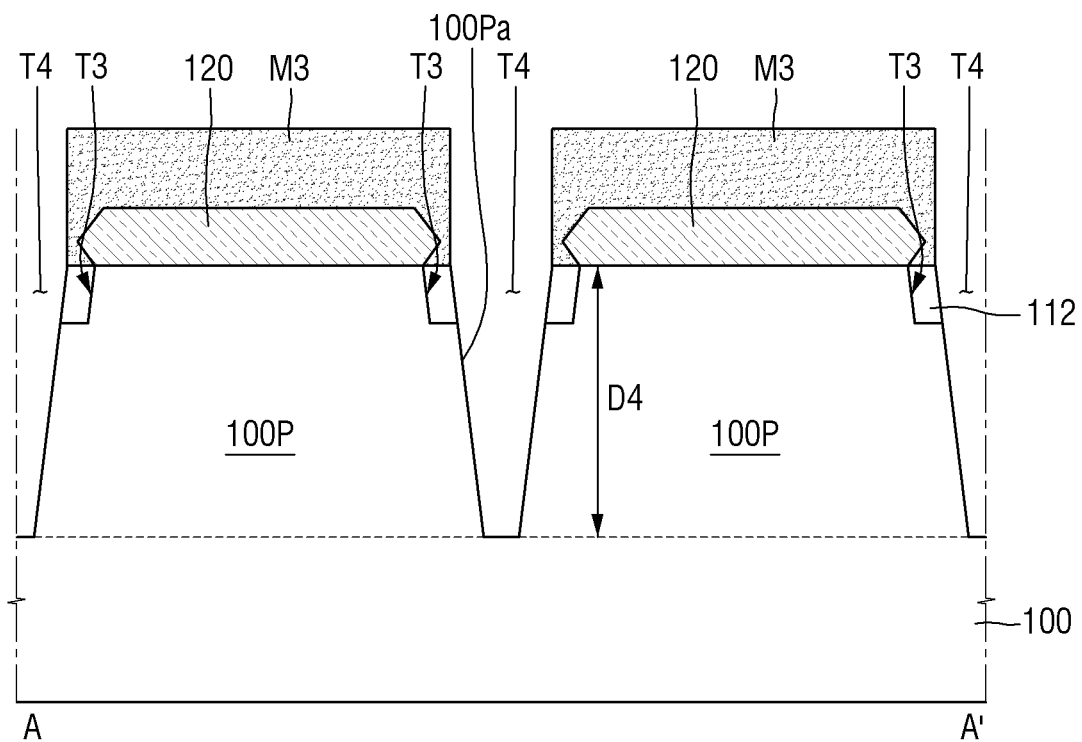
Figure 21:
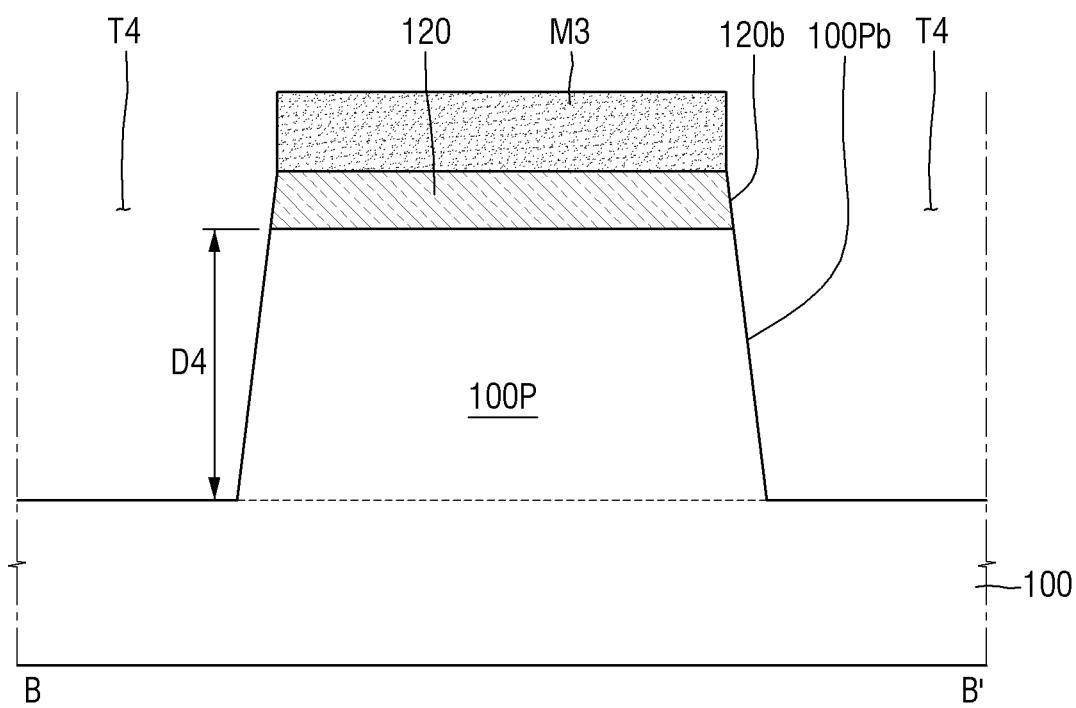
Figure 22:
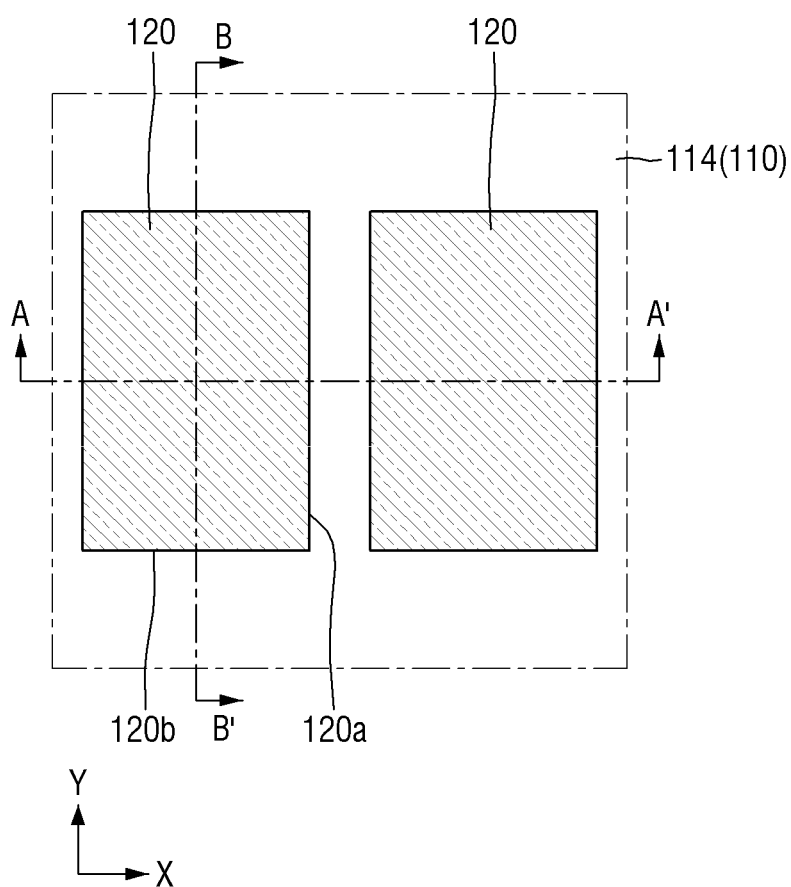
Figure 23:
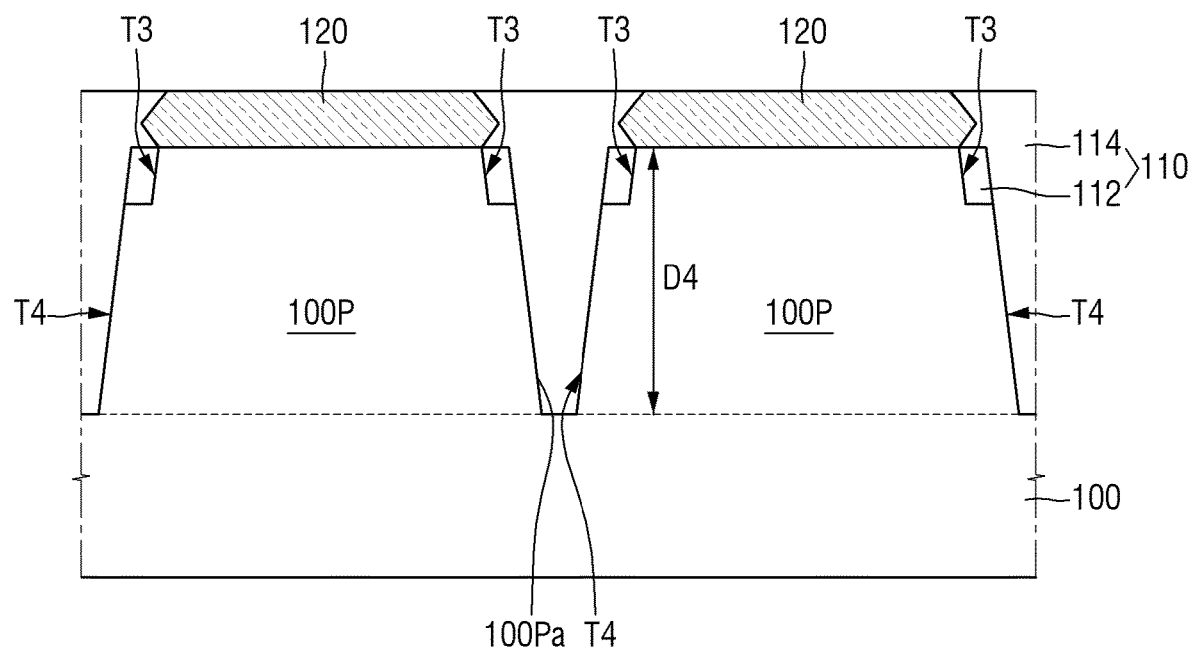
Figure 24:
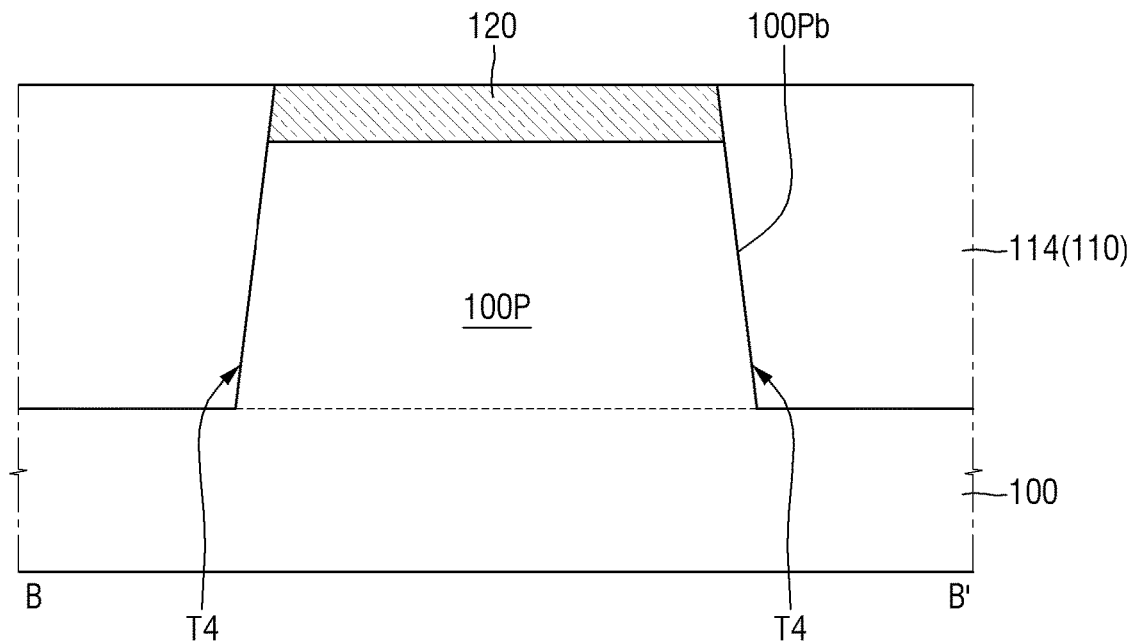

FIGS. 17 to 24 are intermediate step diagrams for explaining a method for fabricating a semiconductor device according to some embodiments of the present inventive concept. For reference, FIG. 17 is a diagram for explaining the steps subsequent to FIG. 2. Further, FIGS. 17 and 18 are cross-sectional views taken along line A-A' of FIG. 3. FIG. 20 is a cross-sectional view taken along the line A-A' of FIG. 19, and FIG. 21 is a cross-sectional view taken along the line B-B' of FIG. 19. FIG. 23 is a cross-sectional view taken along line A-A' of FIG. 22, and FIG. 24 is a cross-sectional view taken along line B-B' of FIG. 22. For the sake of convenience of explanation, repeated parts of description provided referring to FIGS. 1 to 16 will be briefly described.

Referring to FIGS. 3 and 17, the first semiconductor pattern 100P extending in the first direction Y is formed in the substrate 100. For example, a third trench T3 extending in the first direction Y may be formed in the substrate 100. Thus, the first semiconductor pattern 100P including the first sidewall 100Pa extending in the first direction Y may be formed. The third trench T3 may be formed at a predetermined depth. For example, the third trench T3 may be formed at the third depth D3 on the basis of the upper surface of the substrate 100 (or the upper surface of the first semiconductor pattern 100P).

Referring to FIG. 18, the first insulating pattern 112 is formed in the third trench T3, and the second semiconductor pattern 120 is formed on the first semiconductor pattern 100P. Since formation of the first insulating pattern 112 and the first semiconductor pattern 100P is similar to that described with reference to FIGS. 5 to 7, the detailed description thereof will not be provided below.

Referring to FIGS. 19 to 21, a third sidewall 120b of the second semiconductor pattern 120 extending in the second direction X is formed. For example, as illustrated in FIG. 21, a fourth trench T4 extending in the second direction X may be formed in the second semiconductor pattern 120. Thus, the second semiconductor pattern 120 including the third sidewall 120b extending in the second direction X may be formed. Further, the first compressive stress applied to the second semiconductor pattern 120 in the first direction Y may be relaxed.

In some embodiments, a part of the fourth trench T4 may extend in the first direction Y. For example, as illustrated in FIGS. 19 and 20, a part of the fourth trench T4 extending in the first direction Y may be formed in the second semiconductor pattern 120.

For example, as illustrated in FIG. 19, a third mask M3 having a rectangular shape may be formed on the second semiconductor pattern 120. Subsequently, the third mask M3 is used as an etching mask, and the second semiconductor pattern 120 may be patterned. Thus, a fourth trench T4 in which a part extends in the first direction Y and the other part extends in the second direction X may be formed. After the third sidewall 120b of the second semiconductor pattern 120 is formed, the third mask M3 may be removed.

In some embodiments, the third mask M3 may be formed to cover at least a part of the second sidewall 120a of the second semiconductor pattern 120. As a result, at least a part of the second sidewall 120a of the second semiconductor pattern 120 may not be patterned. Also, the second compressive stress applied to the second semiconductor pattern 120 in the second direction X may be maintained.

In some embodiments, the fourth trench T4 may be formed to be deeper than the third trench T3. For example, the fourth trench T4 may be formed at a fourth depth D4 deeper than the third depth (D3 of FIG. 17) on the basis of the upper surface of the substrate 100 (or the upper surface of the first semiconductor pattern 100P). Thus, in some embodiments, the first sidewall 100Pa of the first semiconductor pattern 100P may have a step-like shape.

Referring to FIGS. 22 to 24, the second insulating pattern 114 is formed in the fourth trench T4. For example, an insulating film for filling the fourth trench T4 may be formed on the first semiconductor pattern 100P and the second semiconductor pattern 120. Subsequently, the planarization process may be performed until the upper surface of the second semiconductor pattern 120 is exposed.

Accordingly, as illustrated in FIGS. 23 and 24, the second insulating pattern 114 which surrounds the sidewall of the first semiconductor pattern 100P and the sidewall of the second semiconductor pattern 120 may be formed. Further, the second insulating pattern 114 may expose the upper surface of the second semiconductor pattern 120.

The first insulating pattern 112 and the second insulating pattern 114 may form an element isolation film 110. In other words, the element isolation film 110 which surrounds the sidewall of the first semiconductor pattern 100P and the sidewall of the second semiconductor pattern 120 may be formed on the substrate 100.

Subsequently, the steps of FIGS. 14 to 16 may be executed. Therefore, it is possible to provide a semiconductor device having improved operating performance and capable of downsizing.

Figure 30:
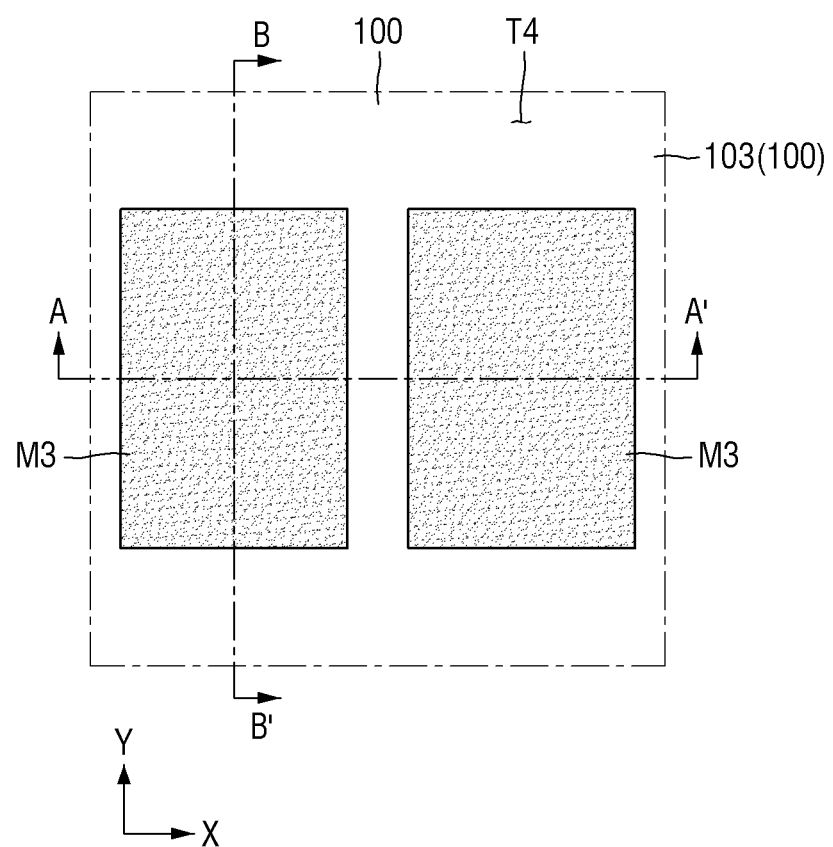
Figure 31:
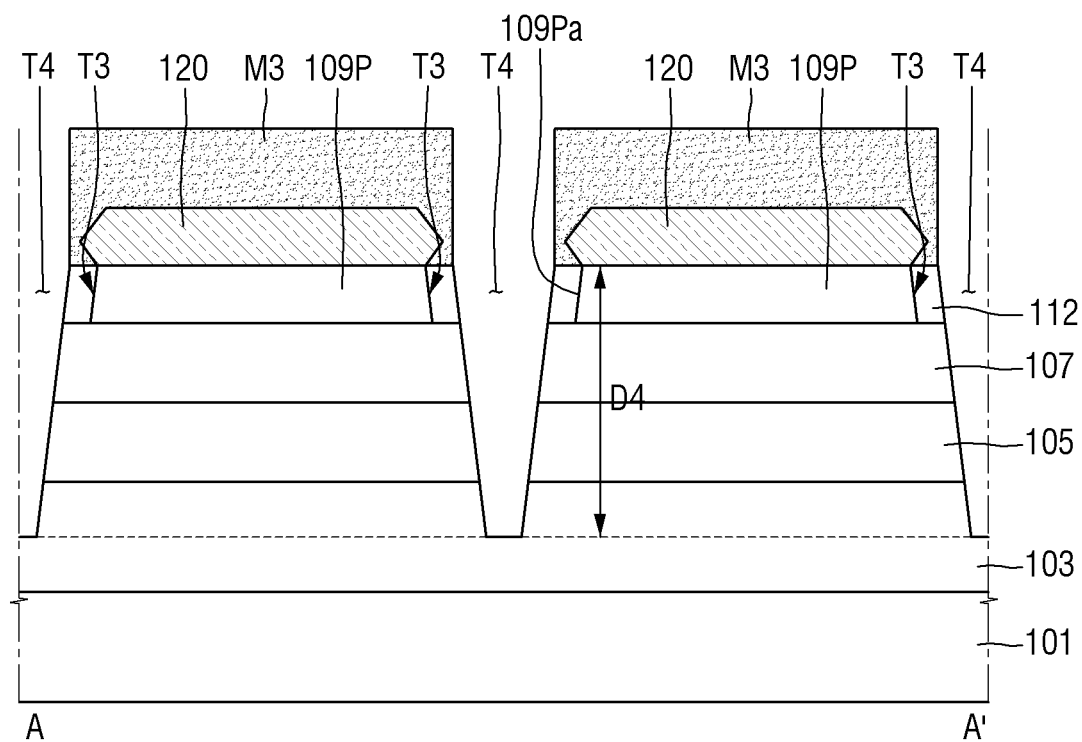
Figure 32:
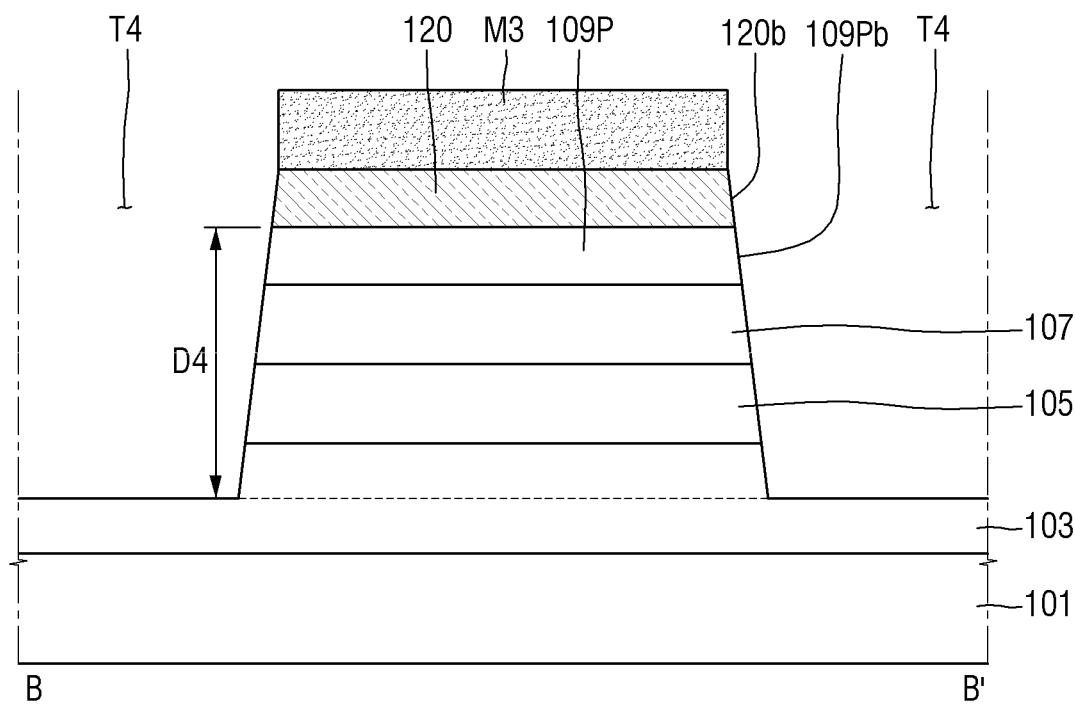
Figure 33:
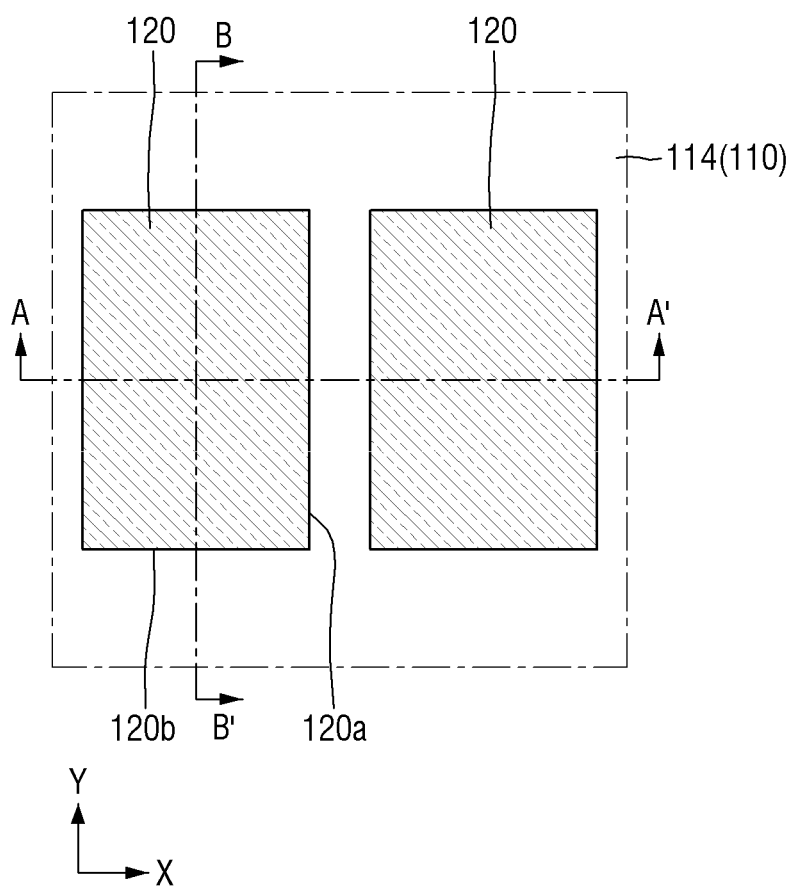
Figure 34:
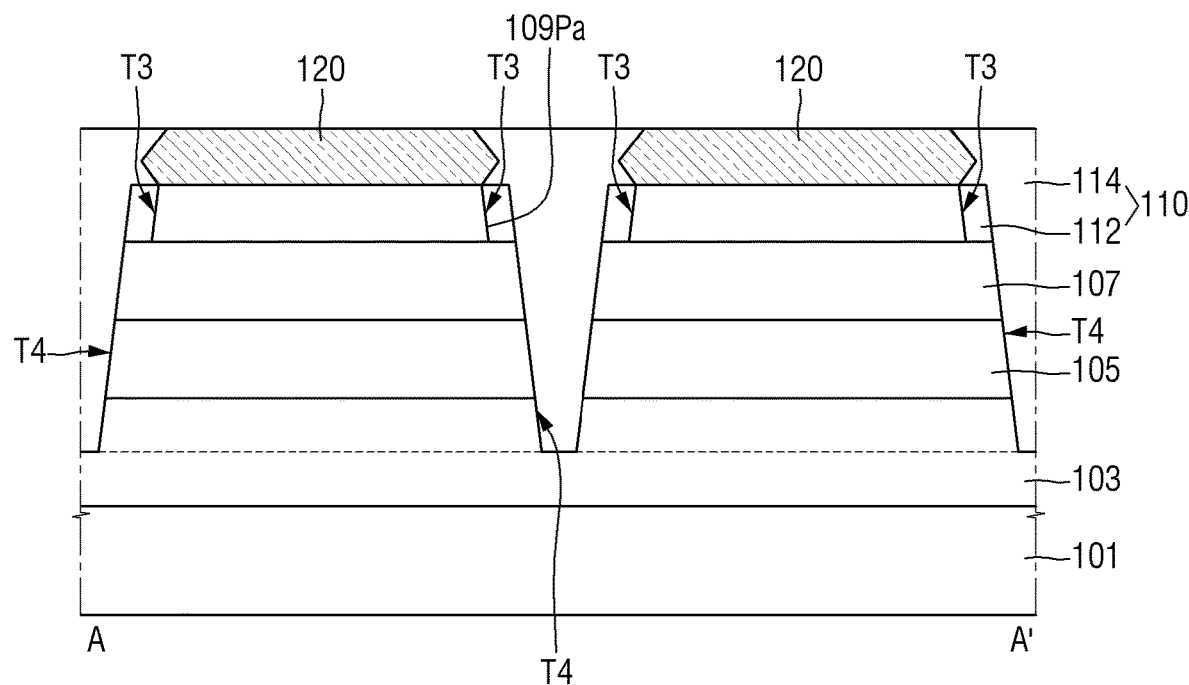
Figure 35:
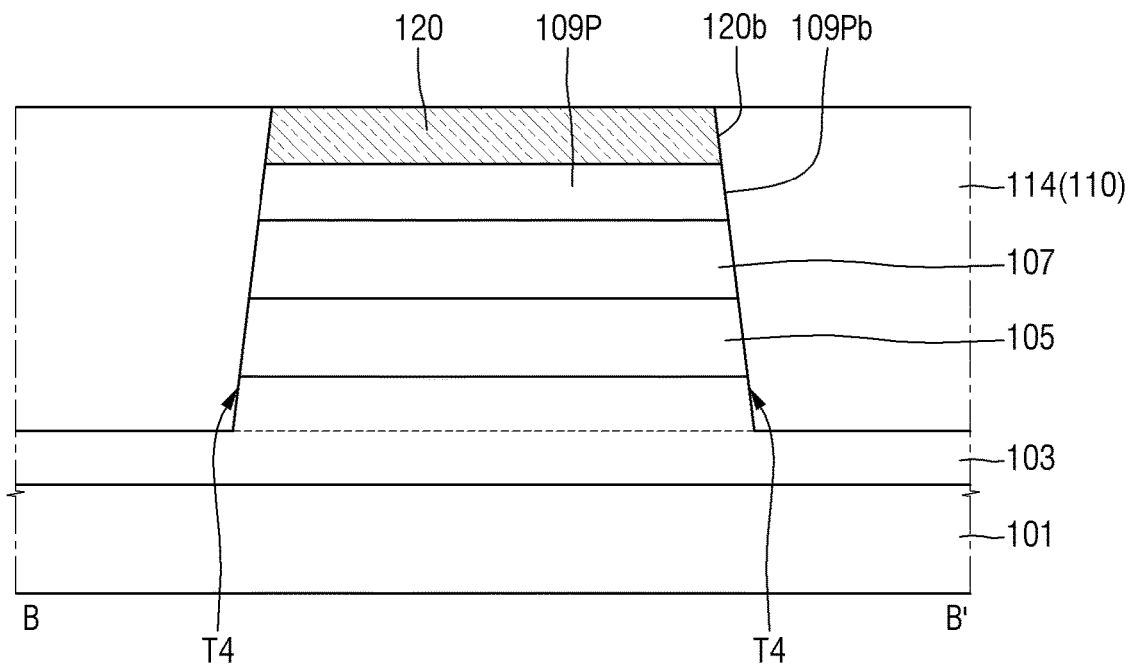

FIGS. 25 to 37 are intermediate step diagrams for explaining the method for fabricating the semiconductor device according to some embodiments of the present inventive concept. For reference, FIGS. 26 to 29 are cross-sectional views taken along line A-A' of FIG. 25. FIG. 31 is a cross-sectional view taken along line A-A' of FIG. 30, and FIG. 32 is a cross-sectional view taken along line B-B' of FIG. 30. FIG. 34 is a cross-sectional view taken along line A-A' of FIG. 33, and FIG. 35 is a cross-sectional view taken along line B-B' of FIG. 33. FIG. 37 is a cross-sectional view taken along line A-A' of FIG. 36. For the sake of convenience of explanation, repeated parts of description provided referring to FIGS. 1 to 24 will be briefly described or omitted.

Figure 25:
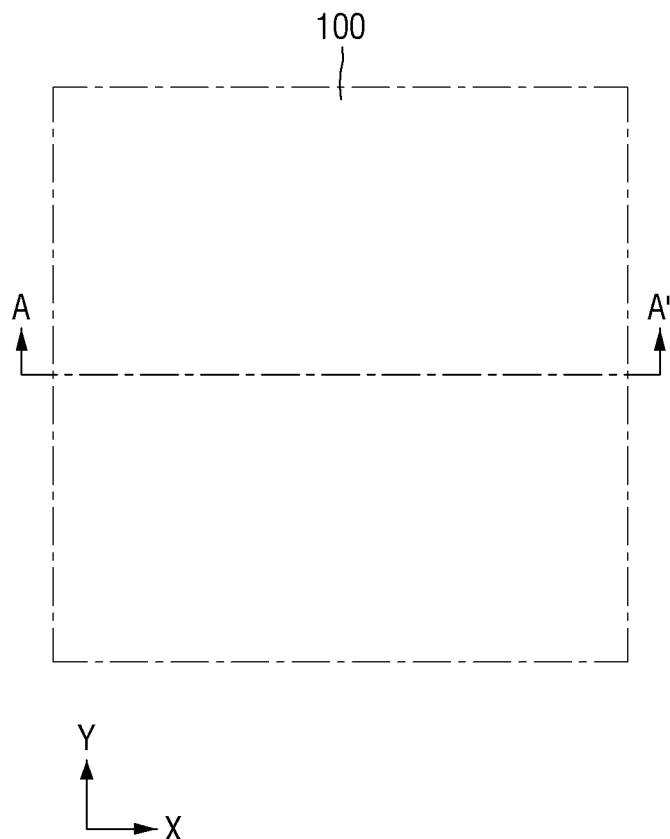
FIGS. 25 to 37 are intermediate step diagrams for explaining the method for fabricating the semiconductor device according to some embodiments of the present inventive concept.
Figure 26:

Referring to FIGS. 25 and 26, the substrate 100 including a base film 101, a well 103, a first semiconductor film 105, a buried insulating film 107 and a second semiconductor film 109 is provided. The well 103 may be formed on the base film 101. In some embodiments, the well 103 may be doped with an impurity of a first conductivity type. For example, the well 103 may be doped with a P-type impurity.

The first semiconductor film 105 may be formed on the well 103. In some embodiments, the first semiconductor film 105 may be doped with an impurity of a second conductivity type different from the first conductivity type. For example, the first semiconductor film 105 may be doped with an N-type impurity.

The buried insulating film 107 may be formed on the first semiconductor film 105. The buried insulating film 107 may include, but is not limited to, at least one of, for example, silicon oxide, silicon nitride, silicon oxynitride, and combinations thereof. The second semiconductor film 109 may be formed on the buried insulating film 107. In some embodiments, the second semiconductor film 109 may be doped with impurity of the second conductivity type. For example, the second semiconductor film 109 may be doped with the N-type impurity. In some embodiments, the second semiconductor film 109 may have a third lattice constant. Hereinafter, as an example, the second semiconductor film 109 will be described as containing silicon (Si).

In some embodiments, the first semiconductor film 105 may function as a body region of the substrate 100. Further, the first semiconductor film 105 may be completely separated from the second semiconductor film 109 by the buried insulating film 107. That is, the first semiconductor film 105 and the second semiconductor film 109 may not be in direct contact with each other.

In some embodiments, the substrate 100 may have an FD-SOI (Fully Depleted Silicon-On-Insulator) structure. For example, a channel of a transistor formed in the second semiconductor film 109 may be fully depleted. Therefore, the method for fabricating the semiconductor device according to some embodiments may provide a semiconductor device in which a short channel effect is effectively prevented.

Figure 27:
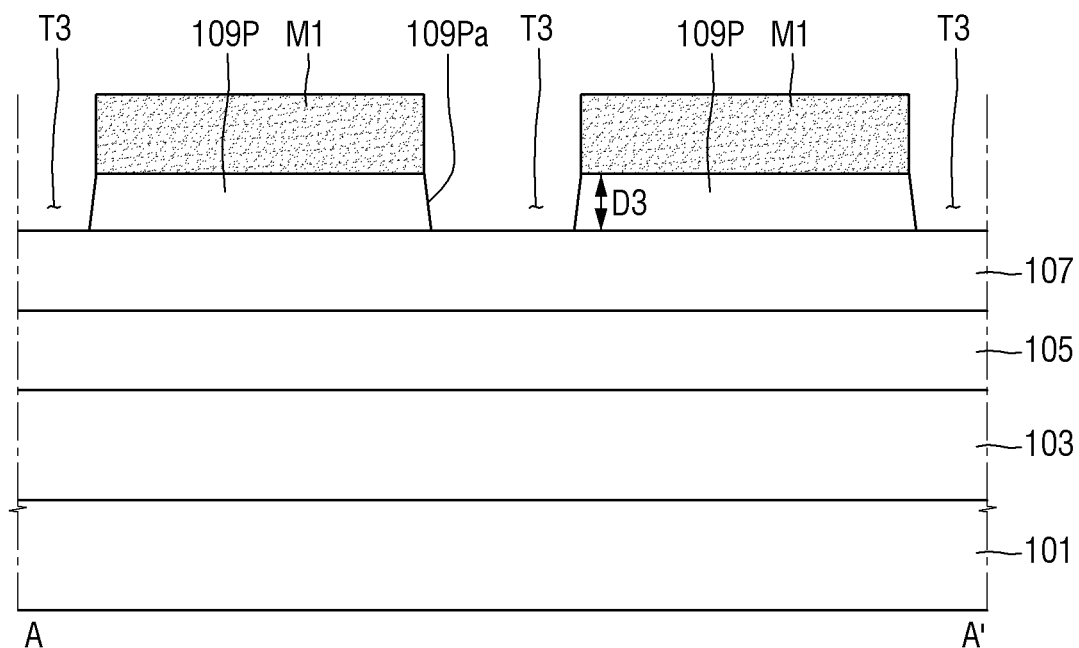

Referring to FIG. 27, a third semiconductor pattern 109P extending in the first direction Y is formed on the buried insulating film 107. For example, the third trench T3 extending in the first direction Y may be formed by patterning the second semiconductor film 109. Thus, a third semiconductor pattern 109P including a fifth sidewall 109Pa extending in the first direction Y may be formed. The third trench T3 may be formed at a predetermined depth. For example, the third trench T3 may be formed at a third depth D3 with the upper surface of the third semiconductor pattern 109P as a reference. In some embodiments, the third trench T3 may be performed until the upper surface of the buried insulating film 107 is exposed. That is, the upper surface of the buried insulating film 107 may be exposed by the third trench T3.

Figure 28:
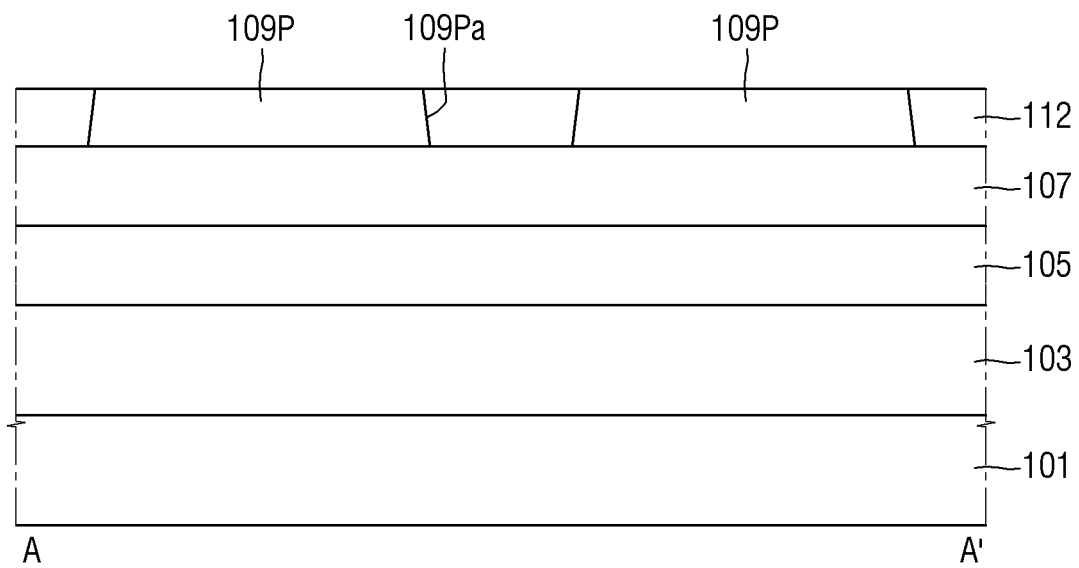

Referring to FIG. 28, the first insulating pattern 112 is formed in the third trench T3. Since the formation of the first insulating pattern 112 is similar to that described with reference to FIG. 5, the detailed description thereof will not be provided below. Accordingly, the first insulating pattern 112 which surrounds the fifth sidewall 109Pa of the third semiconductor pattern 109P may be formed.

Figure 29:
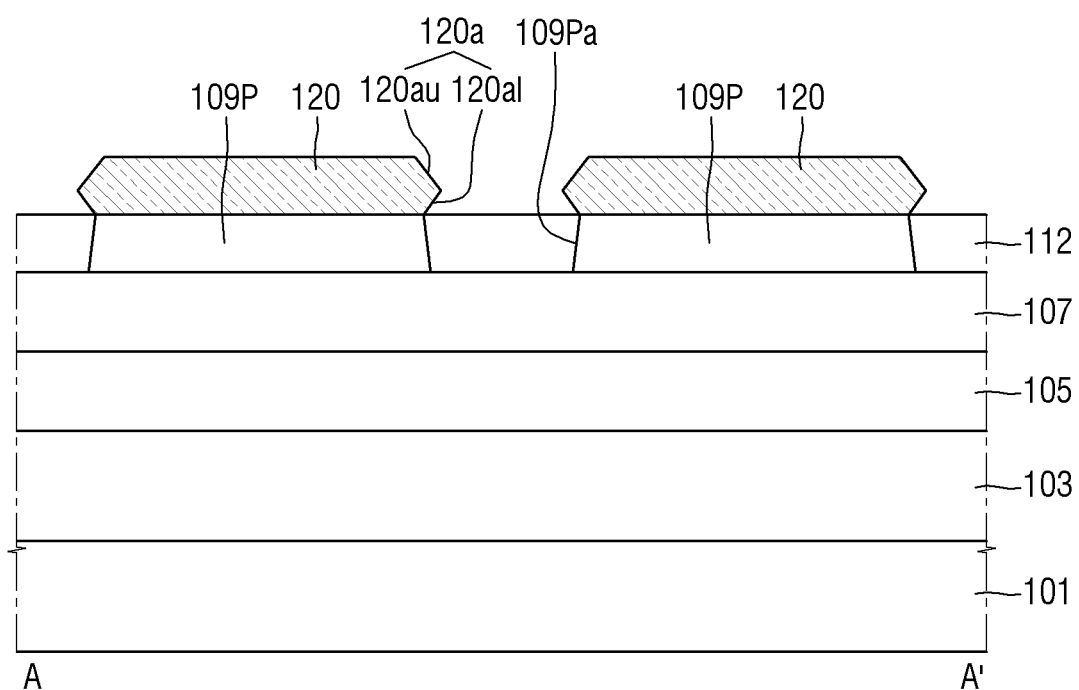

Referring to FIG. 29, the second semiconductor pattern 120 is formed on the third semiconductor pattern 109P. The second semiconductor pattern 120 may be formed to extend in the first direction Y on the third semiconductor pattern 109P. Accordingly, the second semiconductor pattern 120 including the second sidewall 120a extending in the first direction Y may be formed. The second semiconductor pattern 120 may have a second lattice constant different from the third lattice constant. Therefore, compressive stress or tensile stress may be applied to the second semiconductor pattern 120.

In some embodiments, the second semiconductor pattern 120 may have a second lattice constant greater than the third lattice constant. For example, the third semiconductor pattern 109P may include silicon (Si), and the second semiconductor pattern 120 may include silicon germanium (SiGe). As a result, the compressive stress may be applied to the second semiconductor pattern 120.

In some embodiments, the formation of the second semiconductor pattern 120 may include crystal-growth of the second semiconductor pattern 120 on the third semiconductor pattern 109P. For example, an epitaxial growth process with the third semiconductor pattern 109P as a seed may be performed. Since the upper surface of the third semiconductor pattern 109P is exposed by the first insulating pattern 112, the second semiconductor pattern 120 may be formed on the upper surface of the third semiconductor pattern 109P.

Referring to FIGS. 30 to 32, a third sidewall 120b of the second semiconductor pattern 120 extending in the second direction X is formed. For example, as illustrated in FIG. 32, a fourth trench T4 extending in the second direction X may be formed in the second semiconductor pattern 120. Thus, the second semiconductor pattern 120 including the third sidewall 120b extending in the second direction X may be formed. Further, the first compressive stress applied to the second semiconductor pattern 120 in the first direction Y may be relaxed.

In some embodiments, a part of the fourth trench T4 may extend in the first direction Y. For example, as illustrated in FIGS. 30 and 31, a part of the fourth trench T4 extending in the first direction Y may be formed in the second semiconductor pattern 120. For example, the third mask M3 may be used as an etching mask, and the second semiconductor pattern 120 may be patterned.

In some embodiments, the third mask M3 may be formed to cover at least a part of the second sidewall 120a of the second semiconductor pattern 120, so that at least a part of the second sidewall 120a of the second semiconductor pattern 120 may not be patterned. Nonetheless, the second compressive stress applied to the second semiconductor pattern 120 in the second direction X may be maintained.

In some embodiments, the fourth trench T4 may be formed to be deeper than the third trench T3. For example, the fourth trench T4 may be formed at a fourth depth D4 deeper than the third depth (D3 of FIG. 27) on the basis of the upper surface of the third semiconductor pattern 109P.

In some embodiments, the formation of the fourth trench T4 may also include patterning of a part of the well 103. For example, the lower surface of the fourth trench T4 may be formed to be lower than the lower surface of the first semiconductor film 105. Thus, the third semiconductor pattern 109P including the sixth sidewall 109Pb extending in the second direction X may be formed. Furthermore, the sidewall of the fourth trench T4 may defined by the sixth sidewall 109Pb of the third semiconductor pattern 109P, the sidewall of the buried insulating film 107, the sidewall of the first semiconductor film 105 and the sidewall of the well 103.

Referring to FIGS. 33 to 35, a second insulating pattern 114 is formed in the fourth trench T4. For example, an insulating film for filling the fourth trench T4 may be formed on the third semiconductor pattern 109P and the second semiconductor pattern 120. Subsequently, the planarization process may be performed until the upper surface of the second semiconductor pattern 120 is exposed. Thus, as illustrated in FIGS. 34 and 35, the second insulating pattern 114 which surrounds the sidewall of the third semiconductor pattern 109P and the sidewall of the second semiconductor pattern 120 may be formed. Further, the second insulating pattern 114 may expose the upper surface of the second semiconductor pattern 120, as illustrated by FIGS. 34-45. The first insulating pattern 112 (shown in FIG. 34) and the second insulating pattern 114 may form the element isolation film 110. That is, the element isolation film 110 which surrounds the sidewall of the third semiconductor pattern 109P and the sidewall of the second semiconductor pattern 120 may be formed.

Figure 36:
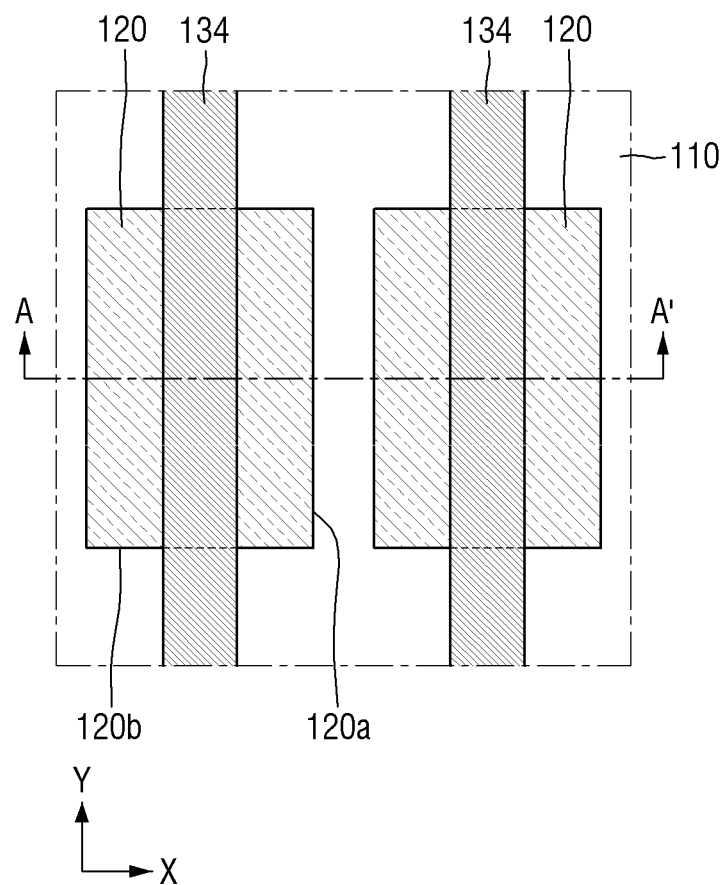
Figure 37:
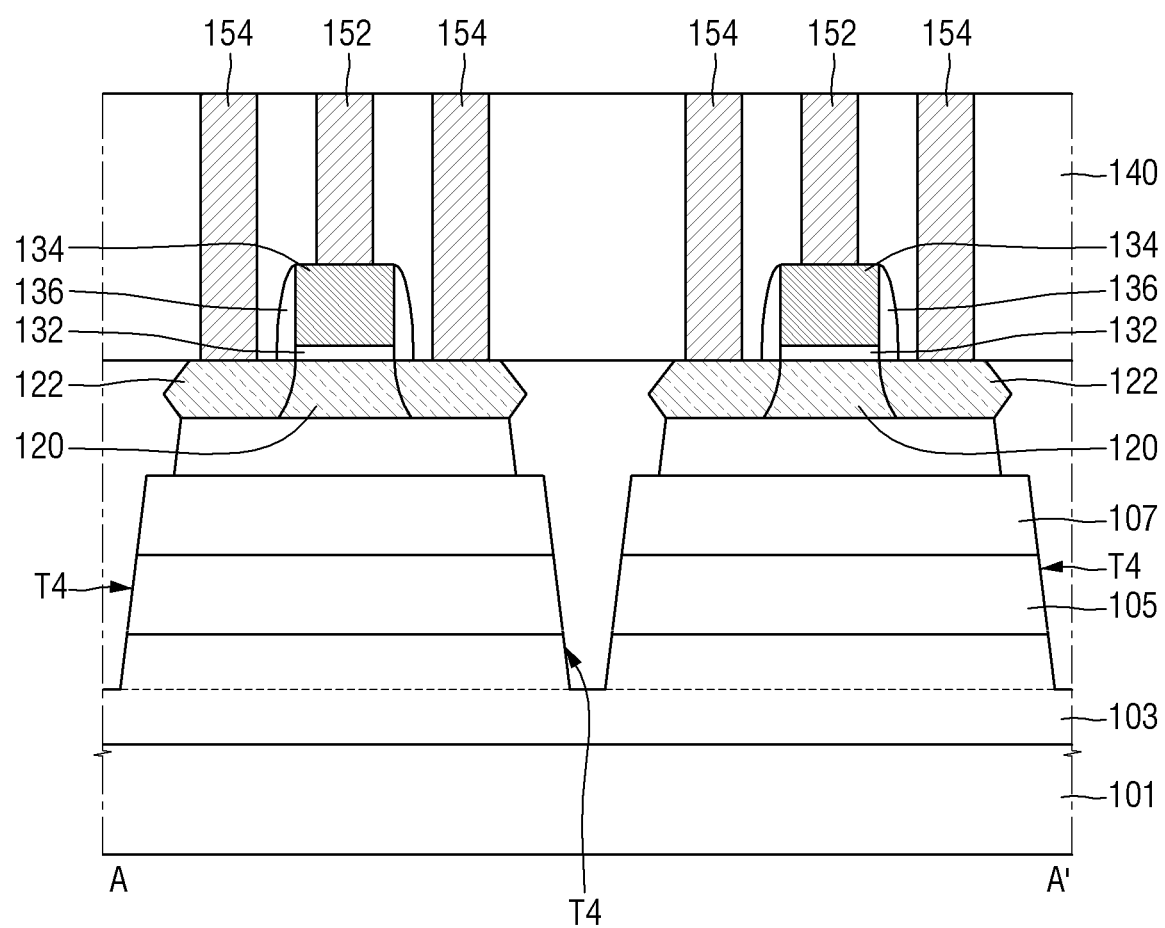

Referring to FIGS. 36 and 37, a gate dielectric film 132, a gate electrode 134, a gate spacer 136, a source/drain region 122, an interlayer insulating film 140, a first contact 152 and a second contact 154 are formed on the second semiconductor pattern 120. Since the formation of the gate dielectric film 132, the gate electrode 134, the gate spacer 136, the source/drain region 122, the interlayer insulating film 140, the first contact 152 and the second contact 154 is similar to that described with reference to FIGS. 14 to 16, the detailed description thereof will not be provided.

Figure 38:
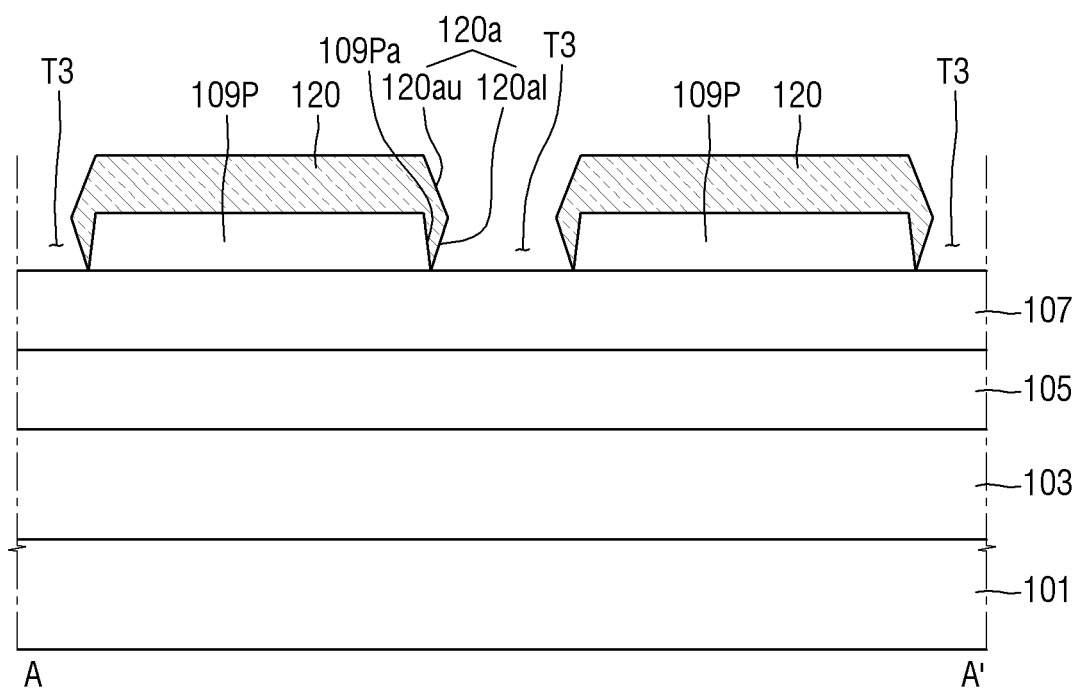
FIGS. 38 to 44 are intermediate step diagrams for explaining the method for fabricating the semiconductor device according to some embodiments of the present inventive concept.
Figure 39:
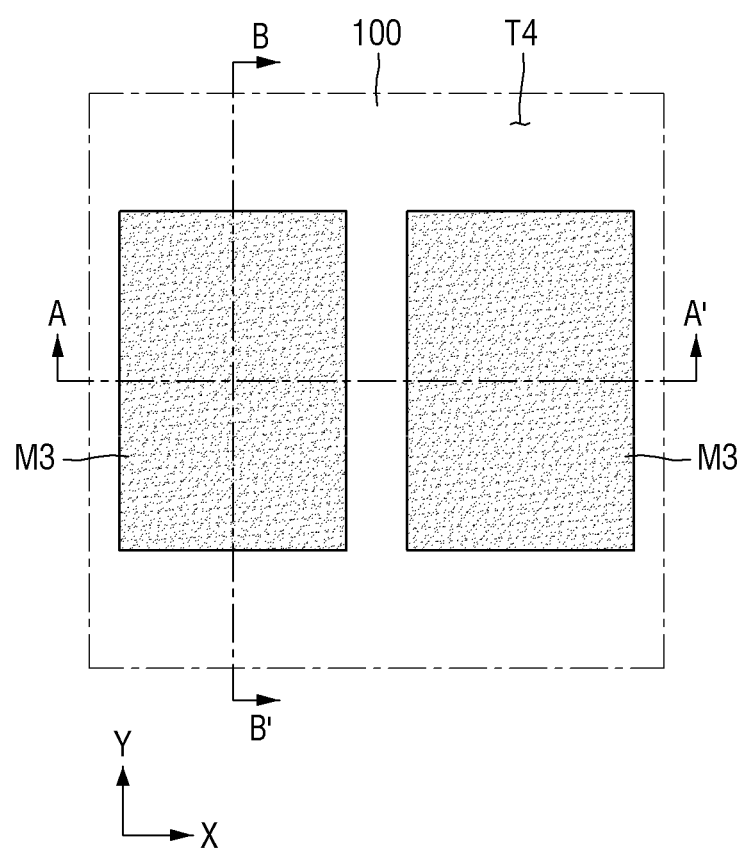
Figure 40:
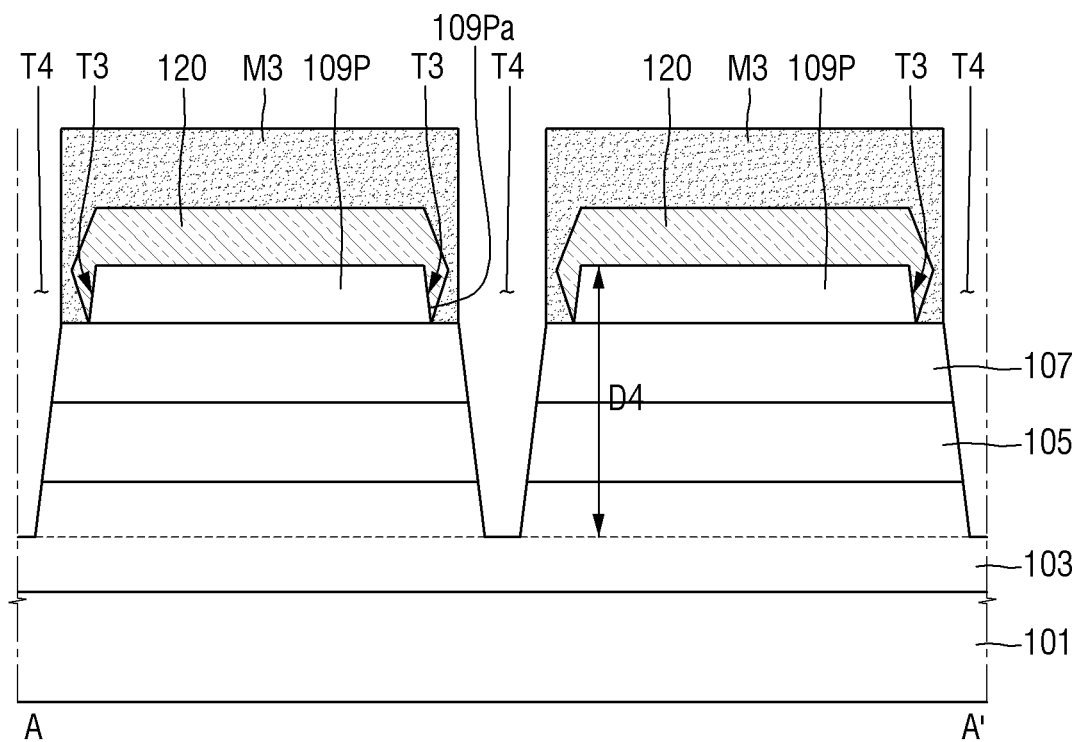
Figure 41:
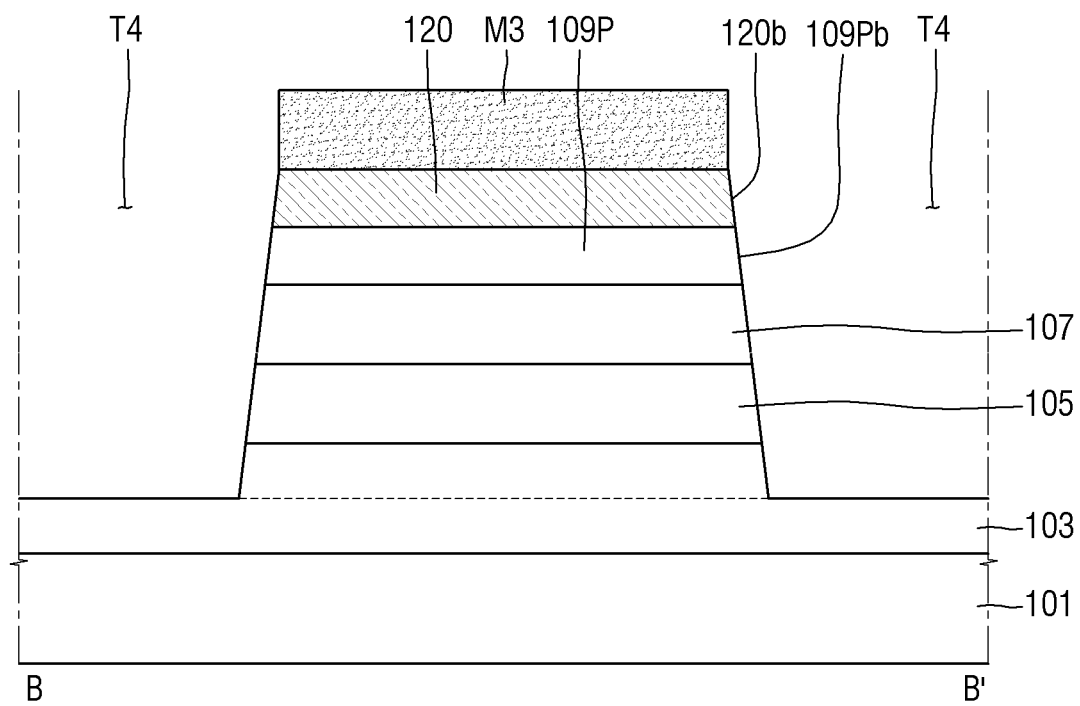
Figure 42:
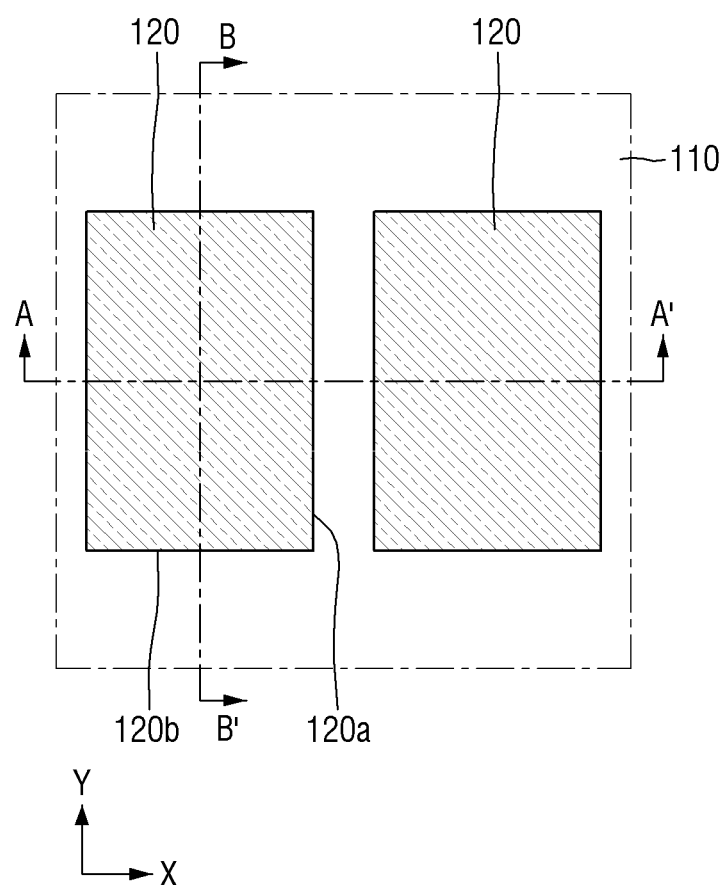
Figure 43:
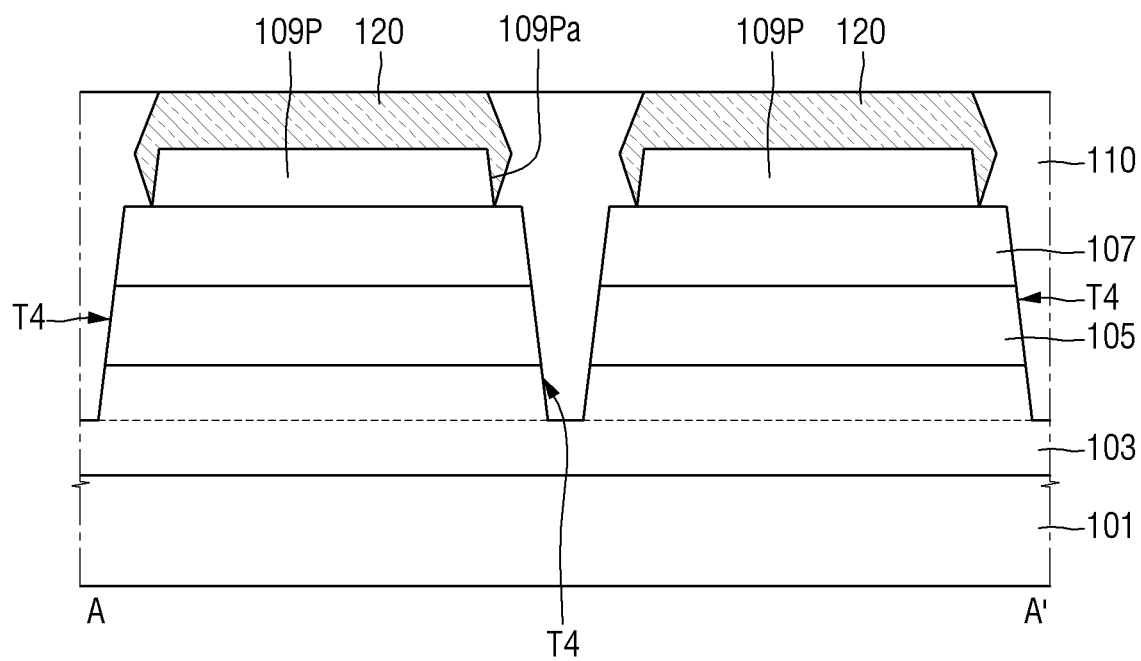
Figure 44:
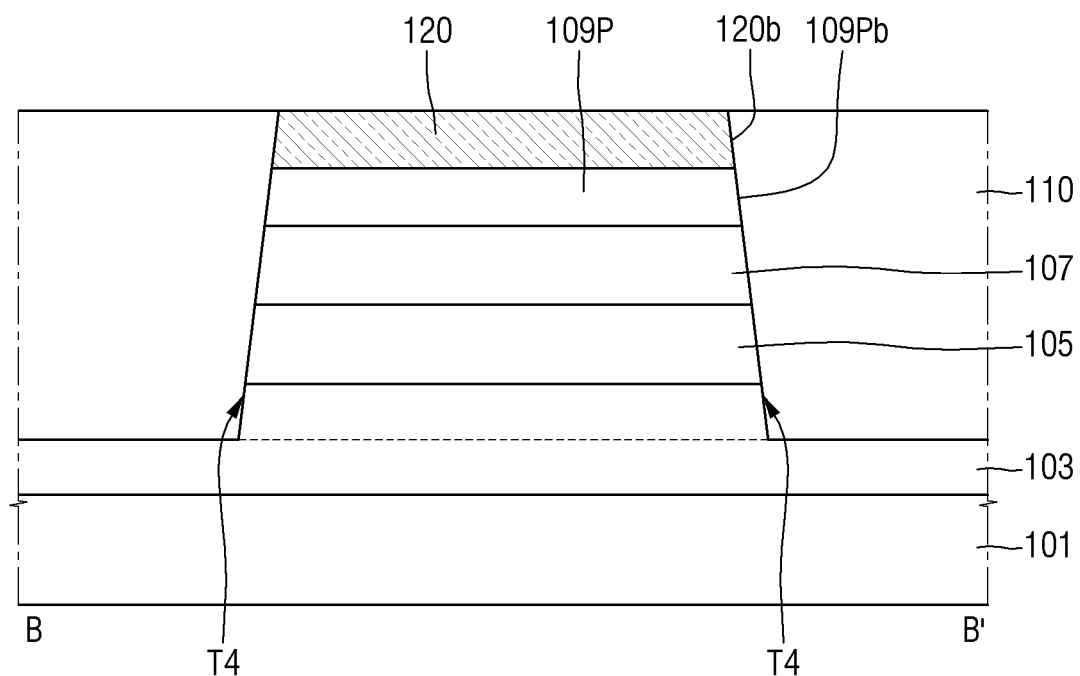

FIGS. 38 to 44 are intermediate step diagrams for explaining the method for fabricating the semiconductor device according to some embodiments of the present inventive concept. For reference, FIG. 38 is a diagram for explaining the procedures subsequent to FIG. 27. FIG. 40 is a cross-sectional view taken along line A-A' of FIG. 39, and FIG. 41 is a cross-sectional view taken along line B-B' of FIG. 39. FIG. 43 is a cross-sectional view taken along line A-A' of FIG. 42, and FIG. 44 is a cross-sectional view taken along line B-B' of FIG. 42. For the sake of convenience of explanation, repeated parts of description provided referring to FIGS. 1 to 37 will be briefly explained or omitted.

Referring to FIG. 38, the second semiconductor pattern 120 is formed on the third semiconductor pattern 109P. The second semiconductor pattern 120 may be formed to extend in the first direction Y on the third semiconductor pattern 109P. Accordingly, the second semiconductor pattern 120 including the second sidewall 120a extending in the first direction Y may be formed.

In some embodiments, the formation of the second semiconductor pattern 120 may include crystal-growth of the second semiconductor pattern 120 on the third semiconductor pattern 109P. For example, an epitaxial growth process with the third semiconductor pattern 109P as a seed may be performed. In some embodiments, the upper surface and the sidewall of the third semiconductor pattern 109P may be exposed. Accordingly, the second semiconductor pattern 120 may be formed on the upper surface and the sidewall of the third semiconductor pattern 109P.

In some embodiments, the second sidewall 120a of the second semiconductor pattern 120 may include a facet. For example, as illustrated in FIG. 38, the second sidewall 120a of the second semiconductor pattern 120 may include a lower sidewall 120al being in contact with the upper surface of the buried insulating film 107, and an upper sidewall 120au on the lower sidewall 120al.

Referring to FIGS. 38 to 41, a third sidewall 120b of the second semiconductor pattern 120 extending in the second direction X is formed. For example, as illustrated in FIG. 41, a fourth trench T4 extending in the second direction X may be formed in the second semiconductor pattern 120. Thus, the second semiconductor pattern 120 including the third sidewall 120b extending in the second direction X may be formed. Further, the first compressive stress applied to the second semiconductor pattern 120 in the first direction Y may be relaxed.

In some embodiments, a part of the fourth trench T4 may extend in the first direction Y. For example, as illustrated in FIGS. 39 and 40, a part of the fourth trench T4 extending in the first direction Y may be formed in the second semiconductor pattern 120. For example, the third mask M3 may be used as an etching mask, and the second semiconductor pattern 120 may be patterned.

In some embodiments, the third mask M3 may be formed to cover at least a part of the second sidewall 120a of the second semiconductor pattern 120. As a result, at least a part of the second sidewall 120a of the second semiconductor pattern 120 may not be patterned. Also, the second compressive stress applied to the second semiconductor pattern 120 in the second direction X may be maintained.

Referring to FIGS. 42 to 44, the element isolation film 110 is formed in the fourth trench T4.

For example, an insulating film for filling the fourth trench T4 may be formed on the third semiconductor pattern 109P and the second semiconductor pattern 120. Subsequently, the planarization process may be performed until the upper surface of the second semiconductor pattern 120 is exposed. As a result, as illustrated in FIGS. 43 and 44, the element isolation film 110 which surrounds the sidewall of the third semiconductor pattern 109P and the sidewall of the second semiconductor pattern 120 may be formed. Furthermore, the element isolation film 110 may expose the upper surface of the second semiconductor pattern 120. Subsequently, the processes of FIG. 36 and FIG. 37 may be executed. Therefore, it is possible to provide a semiconductor device having improved operating performance and capable of downsizing.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A method of fabricating a semiconductor device, comprising:
   providing a substrate including a semiconductor material having a first lattice constant;
   patterning the substrate to form a first semiconductor pattern extending in a first direction;
   forming a second semiconductor pattern on and in contact with the first semiconductor pattern, the second semiconductor pattern extending in the first direction and having a second lattice constant that is sufficiently greater than the first lattice constant so that lattice stress is present at an interface between the first semiconductor pattern and the second semiconductor pattern;
   patterning the second semiconductor pattern to form a sidewall of the second semiconductor pattern extending in a second direction intersecting the first direction; and
   forming a gate electrode extending in the first direction on the second semiconductor pattern; and
   wherein the second semiconductor pattern is disposed between an upper surface of the first semiconductor pattern and a bottom surface of the gate electrode.

2. The method of claim 1, wherein the first semiconductor pattern includes silicon (Si), and the second semiconductor pattern includes silicon germanium (SiGe).

3. The method of claim 1, wherein forming the second semiconductor pattern includes performing an epitaxial growth process using the first semiconductor pattern as a seed.

4. The method of claim 1, wherein the substrate includes a first semiconductor film, a buried insulating film and a second semiconductor film, which are sequentially stacked so that the buried insulating film is on the first semiconductor film and the second semiconductor film is on the buried insulating film.

5. The method of claim 4, wherein forming the first semiconductor pattern includes patterning of the second semiconductor film.

6. The method of claim 1, further comprising:
   forming an element isolation film which surrounds the first semiconductor pattern and the second semiconductor pattern, before forming the gate electrode.

7. The method of claim 1, wherein forming the first semiconductor pattern includes forming a first trench extending in the first direction in the substrate;
   and wherein forming the sidewall of the second semiconductor pattern includes forming a second trench extending in the second direction in the substrate.

8. The method of claim 7, wherein the first trench is formed at a first depth; and wherein the second trench is formed at a second depth deeper than the first depth.

9. The method of claim 1, wherein forming the first semiconductor pattern includes patterning the substrate, using a first mask extending in the first direction as an etching mask; and wherein forming the sidewall of the second semiconductor pattern includes patterning the second semiconductor pattern, using a second mask extending in the second direction as an etching mask.

10. The method of claim 1, further comprising forming a source/drain region in the second semiconductor pattern on a sidewall of the gate electrode, after forming the gate electrode.

11. The method of claim 10, wherein forming the source/drain regions includes doping of impurity into the second semiconductor pattern.

12. The method of claim 10, wherein the source/drain region includes a P-type impurity.

13. A method of fabricating a semiconductor device, comprising:
   providing a substrate in which a first semiconductor film, a buried insulating film and a second semiconductor film are sequentially stacked;
   forming a first trench extending in a first direction in the second semiconductor film;
   performing an epitaxial growth process using the second semiconductor film as a seed to form a semiconductor pattern extending in the first direction;

forming a second trench defining a sidewall of the semiconductor pattern extending in a second direction intersecting the first direction; and forming an element isolation film which fills the first trench and the second trench.

14. The method of claim 13, wherein a first lattice constant of the second semiconductor film and a second lattice constant of the semiconductor pattern are different from each other.

15. The method of claim 13, wherein forming the first trench comprises etching the first trench for a sufficient duration to expose an upper surface of the buried insulating film.

16. The method of claim 13, wherein the second trench is formed to be deeper than the first trench.

17. The method of claim 13, wherein at least a part of the second trench extends in the first direction.

18. The method of claim 13, wherein said performing an epitaxial growth process occurs after said forming the first trench and before said forming the second trench.

19. The method of claim 13, wherein forming the element isolation film comprises:

forming a first insulating pattern which fills the first trench, before forming the semiconductor pattern, and forming a second insulating pattern which fills the second trench.

20. A method of fabricating a semiconductor device, comprising:

providing a substrate including a semiconductor material therein having a first lattice constant;

forming a semiconductor pattern having a second lattice constant greater than the first lattice constant on the semiconductor material, the semiconductor pattern having a first sidewall and a second sidewall intersecting the first sidewall;

forming an element isolation film which surrounds the first sidewall and the second sidewall, on the substrate; and forming a gate electrode intersecting the second sidewall on the semiconductor pattern and the element isolation film;

wherein a first angle formed between a lower surface of the semiconductor pattern and the first sidewall is greater than a second angle formed between the lower surface of the semiconductor pattern and the second sidewall.

* * * * *